(12) United States Patent
Girard et al.

(10) Patent No.: US 6,631,052 B1
(45) Date of Patent: *Oct. 7, 2003

(54) HEAD INTERCONNECT WITH SUPPORT MATERIAL CARBONIZED SHUNT

(75) Inventors: Mark T. Girard, South Haven, MN (US); Ryan A. Jurgenson, Hutchinson, MN (US)

(73) Assignee: Applied Kinetics, Inc., Hutchinson, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/372,283

(22) Filed: Aug. 11, 1999

Related U.S. Application Data

(63) Continuation-in-part of application No. 09/274,367, filed on Mar. 23, 1999, and a continuation-in-part of application No. 09/273,661, filed on Mar. 23, 1999
(60) Provisional application No. 60/115,754, filed on Jan. 13, 1999.

(51) Int. Cl.[7] ............................ G11B 5/48; G11B 21/16
(52) U.S. Cl. ..................... 360/245.8; 360/323; 174/250
(58) Field of Search ........................... 360/245.9, 245.8, 360/246, 323; 174/250

(56) References Cited

U.S. PATENT DOCUMENTS

| | | | |
|---|---|---|---|
| 4,691,091 A | 9/1987 | Lyons et al. ............... | 219/121 |
| 5,182,230 A | 1/1993 | Donelon et al. ............ | 437/173 |
| 5,465,186 A | 11/1995 | Bajorek et al. ............ | 360/113 |
| 5,491,605 A | 2/1996 | Hughbanks et al. ........ | 360/113 |
| 5,638,237 A | 6/1997 | Phipps et al. .............. | 360/128 |
| 5,644,454 A | 7/1997 | Arya et al. ................. | 360/106 |
| 5,699,212 A | 12/1997 | Erpelding et al. .......... | 360/104 |
| 5,759,428 A | 6/1998 | Balamane et al. ......... | 219/121.66 |
| 5,812,349 A | 9/1998 | Shouji et al. .............. | 360/110 |
| 5,812,357 A | 9/1998 | Johansen et al. .......... | 361/212 |
| 2002/0100607 A1 * | 8/2002 | Girard et al. .............. | 174/250 |

OTHER PUBLICATIONS

H.M. Phillips, T. Feurer, S. P. LeBlanc, D.L. Callahan and R. Sauerbrey, "Excimer Laser Induced Permanent Electrical Conductivity and Nanostructures in Polymers", undated, published in SPIE vol. 1856 Laser Radiation Photophysics (1993), pp. 143–154.

H.M. Phillips, Yunjun Li, and Binglin Zhang, "Laser Induced Permanent Electrical Conductivity in Insulating Metal–Polymer Composites", undated, published in SPIE vol. 2888, pp. 404–413.

* cited by examiner

Primary Examiner—Craig A. Renner
(74) Attorney, Agent, or Firm—Kagan Binder, PLLC

(57) ABSTRACT

The present invention provides a method for the creation and removal of shunts for the prevention of ESD/EOS damage to electrical components. In one embodiment of the present invention, the conductive pathway is provided and removed by exposing the interconnect's carbonizable and ablatable substrate to a radiant energy source such as a laser beam. The present invention also provides for interconnects that include at least two conductive wires or leads engaged on at least one surface by a carbonizable and ablatable material. The conductive wires may each include a branched dead end lead portion interleaved with the branched dead end lead portion of the other. Alternatively, the conductive wires may extend in close proximity to each other in a curved or sinuous or serpentine or backtracking pattern. An interconnect in accord with the present invention may include a substrate substantially supporting the conductive wires except at predetermined locations or proposed shunt sites wherein there is at least one through hole in the substrate.

5 Claims, 28 Drawing Sheets

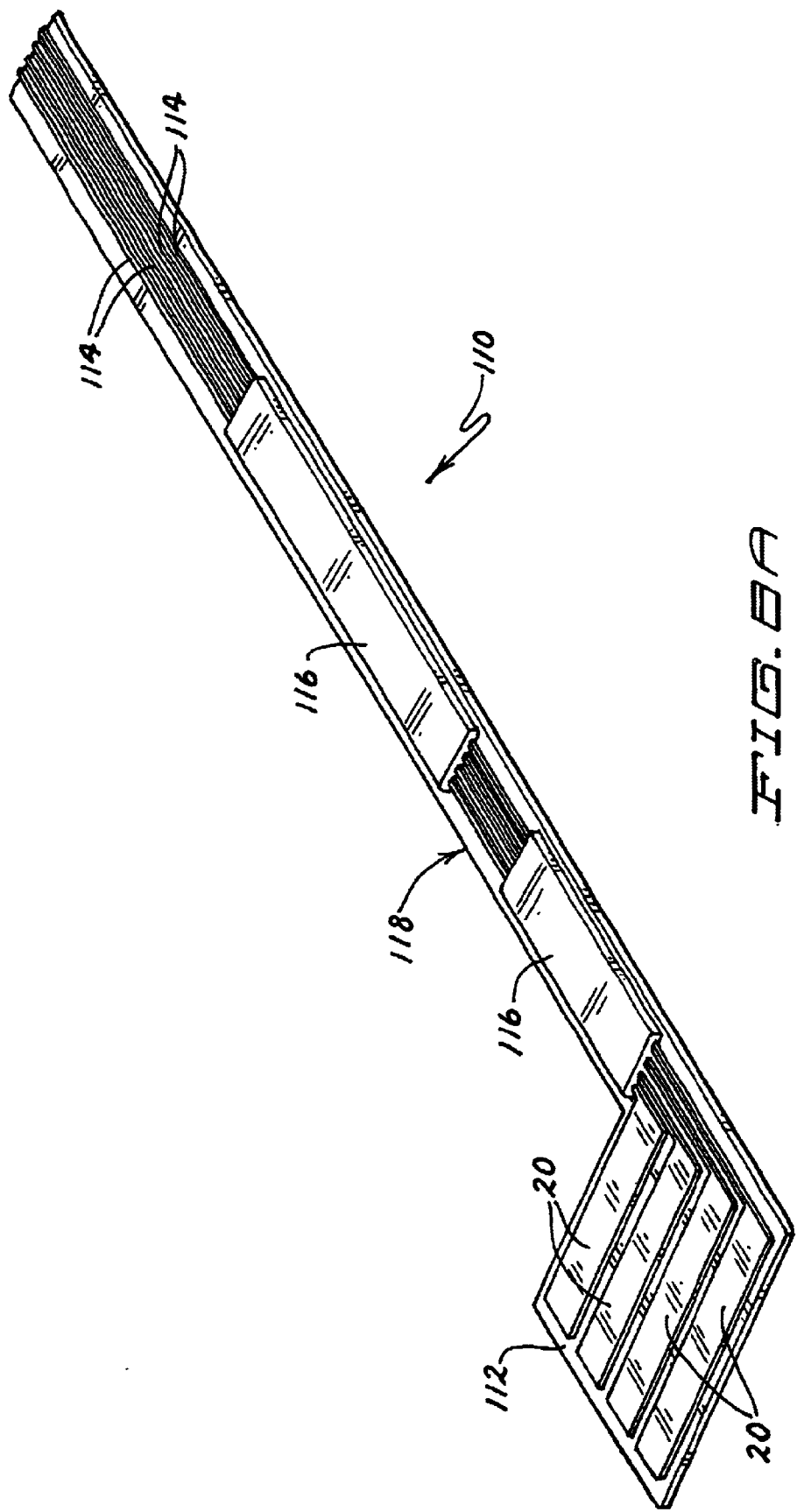

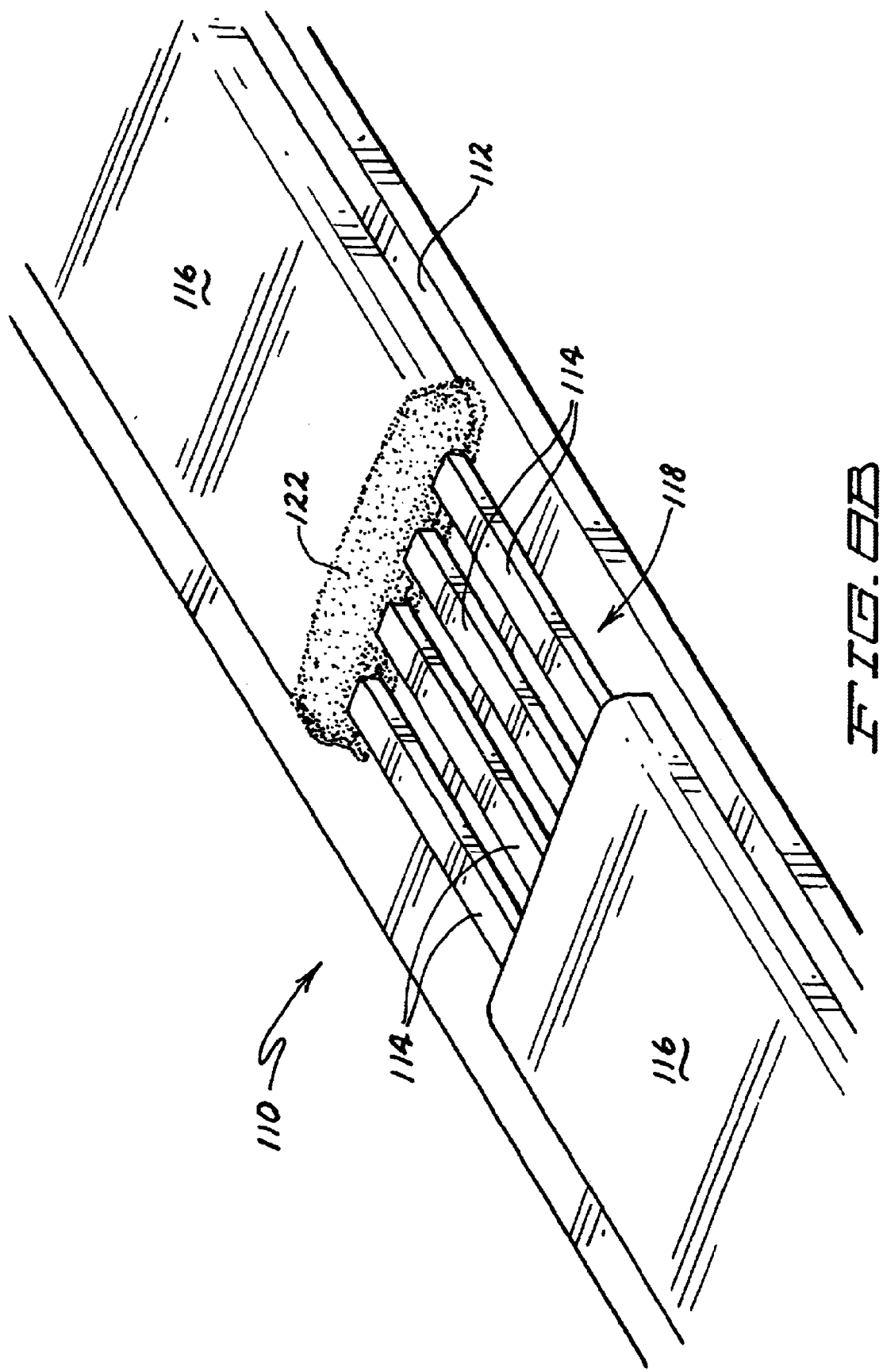

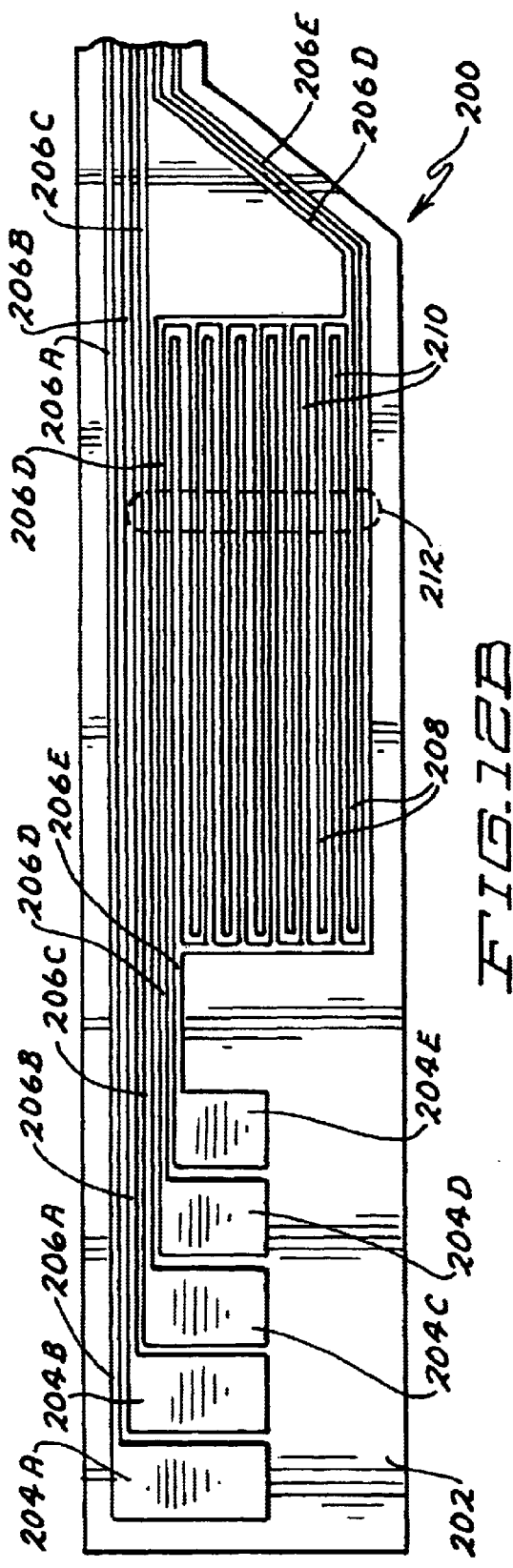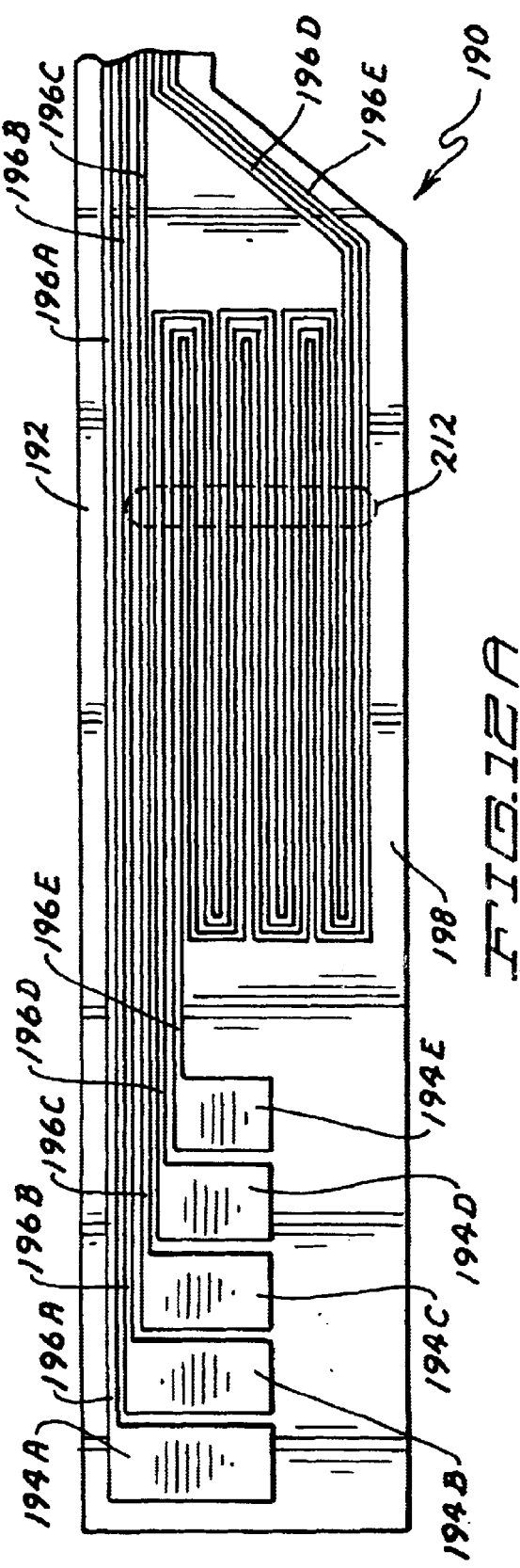

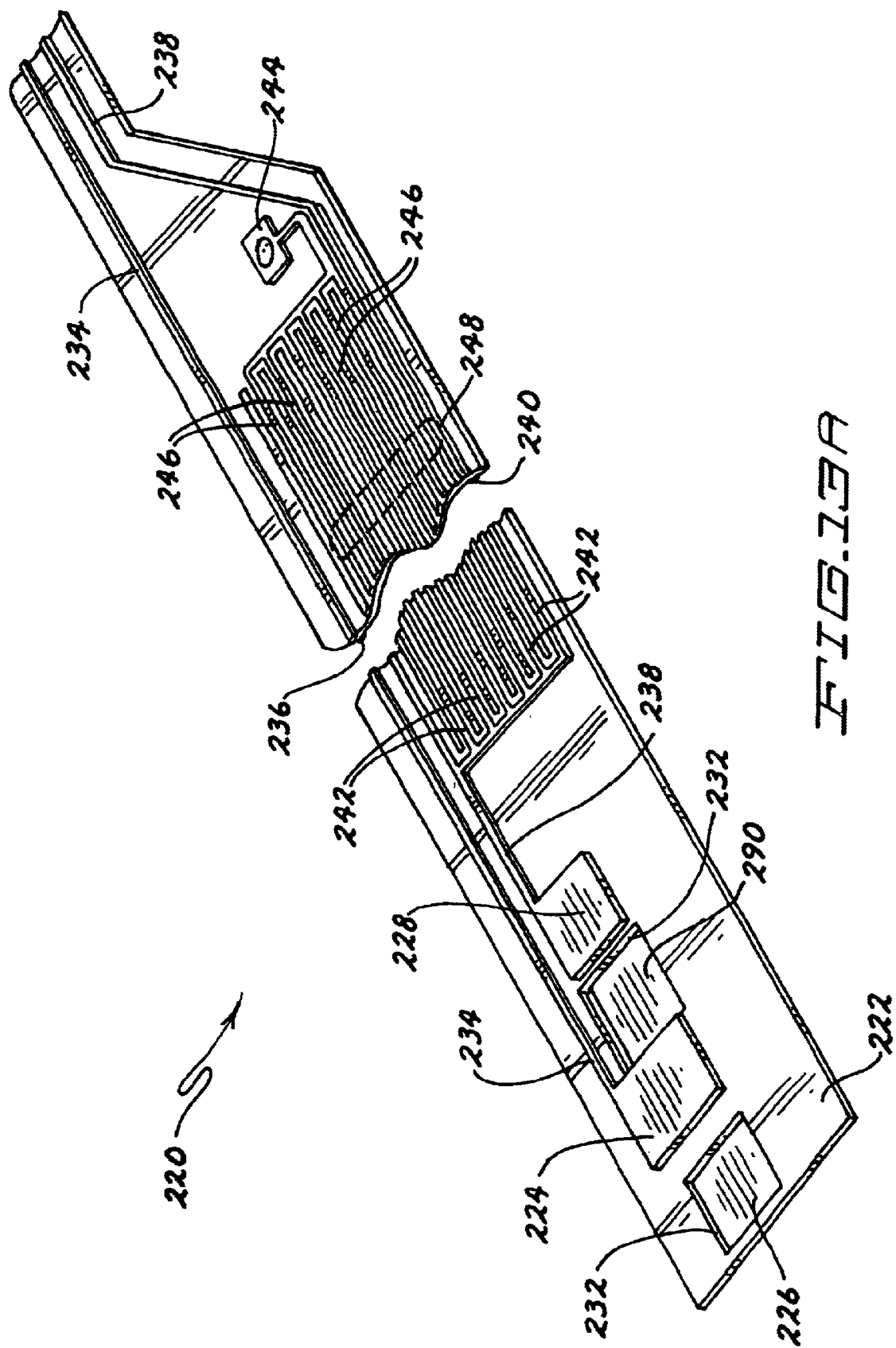

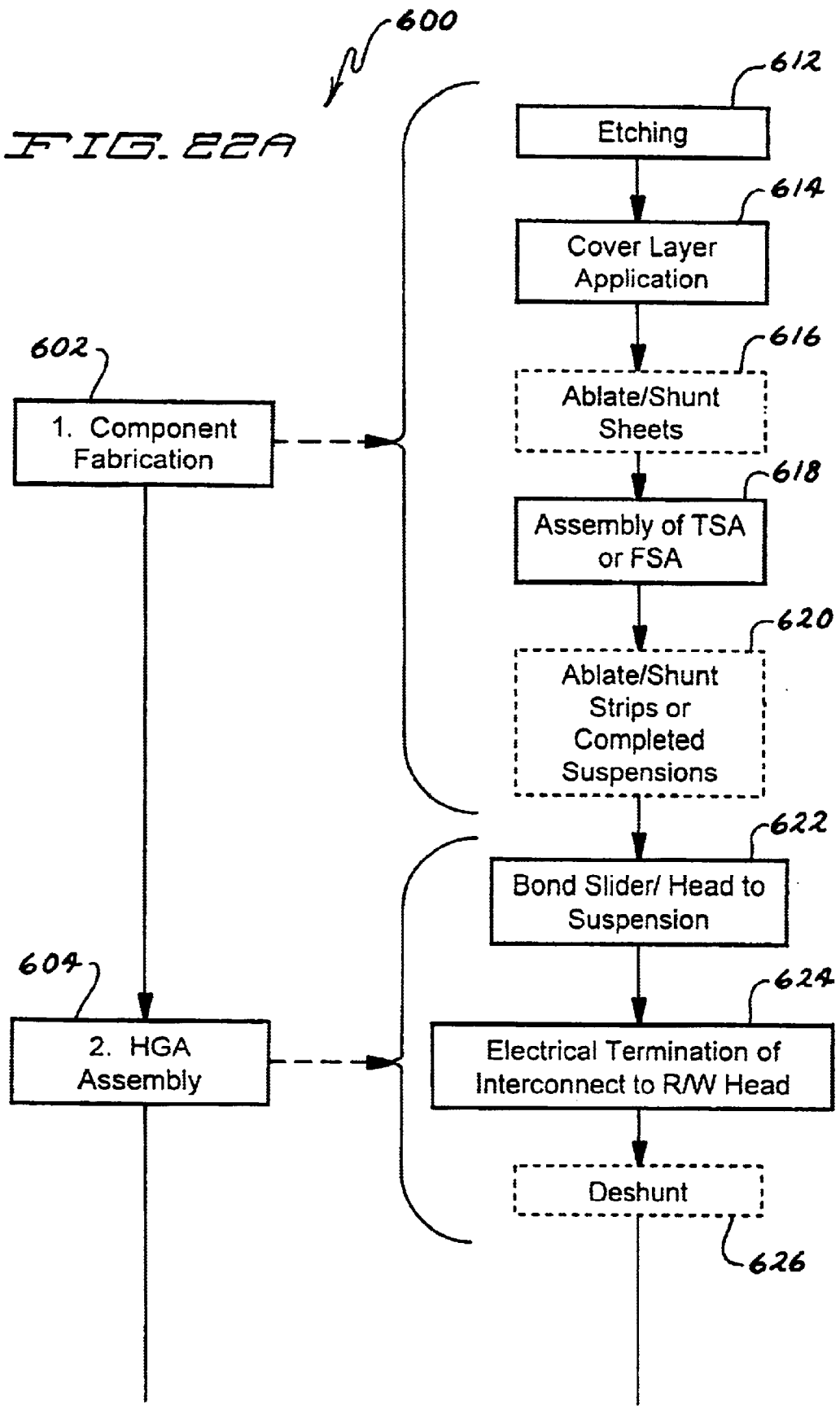

HEAD INTERCONNECT WITH SUPPORT MATERIAL CARBONIZED SHUNT

RELATED APPLICATIONS

This application is a continuation-in-part of pending prior application Ser. No. 60/115,754 entitled Method for Shunting, De-Shunting and Reshunting HGA Electrical Interconnects, filed on Jan. 13, 1999; Ser. No. 09/273,661 entitled Method for Shunting and Deshunting an Electrical Component and a Shuntable/Shunted Electrical Component, filed on Mar. 23, 1999; and Ser. No. 09/274,367 entitled An Electrical Component and a Shuntable/Shunted Electrical Component and Method for Shunting and Deshunting, filed Mar. 23, 1999.

FIELD OF INVENTION

The present invention relates generally to methods for eliminating or reducing potential damage to devices from electrostatic discharge or electrical overstress and to such devices, and particularly to methods for reducing such damage to electronic components such as but not limited to a magnetoresistive head forming part of a hard disk drive.

BACKGROUND OF THE PRESENT INVENTION

Damage due to electrostatic discharge (ESD) and/or electrical overstress (EOS) costs industry uncounted and perhaps uncountable dollars daily in damaged and irreparable goods. More specifically, ESD/EOS damage is a particular problem in the electronics industry where the components are, of course, designed to conduct electricity in the first instance and where their continuously shrinking size renders them increasingly susceptible to such damaging effects. Generally, ESD refers to actual discharges while EOS refers to the effects of such discharges or currents induced by such discharges or other electrical or magnetic fields. For present purposes, reference to one should be interpreted to include the other.

ESD, familiarly manifested by the lightning bolts or by the shock received when touching a door knob, after walking across a carpet, can range from a few volts to as much as several thousand volts, resulting in extremely large transient currents. As electronic components shrink in size they become ever more susceptible to damage from smaller and small voltages and current.

ESD can arise in several different ways, most commonly as a result of triboelectric charging or induction. Triboelectric charging causes a charge build up due to the frictional engagement of two objects. That is, static charge builds up as a result of a series of contacts and separations of two objects. Electrons travel from one object to the other during these contacts depending on the relative abilities of the objects to gain or lose electrons, that is, depending upon the position of the two objects in the electrochemical potential series. Consequently, a net charge of opposite sign will build up and remain on both of the objects after their separation. Where the object has good conductivity and is grounded, charge will flow to the ground. If the electric field generated by the separated charges is strong enough, an electrostatic discharge can occur in form of a spark traveling across an air gap from one object towards an object at a lower electrostatic potential, thus providing the familiar blue light generated by the spark. This discharge can occur either as one object is brought next to one of the charged objects or as one object is separated from the other.

Static charges can also build up by induction. That is, if a charged object is brought near an uncharged object, the electric field of the charged object will induce a charge in the object, generating an electric field and potentially a static discharge.

A goal in many industries, then, is to determine methods and apparatus for reducing or eliminating static discharges. One of the electronics industries affected by ESD/EOS damage is that which manufactures and assembles computer hard disk drives. As noted above, present hard disk drives include a disk rotated at high speeds and a read/write head that, in industry parlance, "flies" a microscopic distance above the disk surface. The disk includes a magnetic coating that is selectively magnetizable. As the head flies over the disk, it "writes" information, that is, data, to the hard disk drive by selectively magnetizing small areas of the disk; in turn, the head "reads" the data written to the disk by sensing the previously written selective magnetizations. The read/write head is affixed to the drive by a suspension assembly and electrically connected to the drive electronics by an electrical interconnect. This structure (suspension, electrical interconnect, and read/write head) is commonly referred to in the industry as a Head Gimbal Assembly, or HGA.

More specifically, currently manufactured and sold read/write heads include an inductive write head and a magnetoresistive (MR) read head or element or a "giant" magnetoresistive (GMR) element to read data that is stored on the magnetic media of the disk. The write head writes data to the disk by converting an electric signal into a magnetic field and then applying the magnetic field to the disk to magnetize it. The MR read head reads the data on the disk as it flies above it by sensing the changes in the magnetization of the disk as changes in the voltage or current of a current passing through the MR head. This fluctuating voltage in turn is converted into data. The read/write head, along with a slider, is disposed at the distal end of an electrical interconnect/suspension assembly.

Other types or read heads, such as inductive read heads, are known, but the MR and GMR elements enable the reading of data that is stored more densely than that which was allowed with the use of inductive read element technology. MR and GMR read elements are much more sensitive to current transients resulting from voltage potentials and thermal gradients, however, than the previous read element technologies. It is now becoming increasingly necessary to manage environmental electrostatic charge levels to as low 3.3 volts during HGA manufacturing processes so as not to damage the MR and GMR elements. Failing to do so, or failing to provide an avenue for the safe discharge of the accumulated electrostatic charge can result in damage to the MR and GMR heads.

Damage to an MR or GMR head can be manifested as physical damage or magnetic damage. In the former, melting of the read element in the head can occur because of the heat generated by the transient current of the discharge. Magnetic damage can occur in the form of loss of sensing ability and instability. Furthermore, direct discharge into the head is not necessary to create the damage. Damaging current flows in the head can also reportedly be created through electromagnetic interference as a result of a distant (relatively speaking) discharge.

An exploded view of a typical electrical interconnect/suspension assembly is shown in FIG. 1, which illustrates several components including a suspension A and an interconnect B. It will be understood that the actual physical structures of these components may vary in configuration depending upon the particular disk drive manufacturer and that the assembly shown in FIG. 1 is meant to be illustrative of the prior art only. Typically, the suspension A will include a base plate C, a radius (spring region) D, a load beam E, and a gimbal F. At least one tooling aperture G may be included. An interconnect B may include a base H, which may be a synthetic material such as a polyimide, that supports typically a plurality of electrical traces or leads I of the interconnect. The electrical interconnect B may also include a polymeric cover layer that encapsulates selected areas of the electrical traces or leads I.

Stated otherwise, suspension A is essentially a stainless steel support structure that is secured to an armature in the disk drive. The read/write head is attached to the tip of the suspension A with adhesive or some other means. The aforementioned electrical interconnect is terminated to bond pads on the read/write head and forms an electrical path between the drive electronics and the read and write elements in the read/write head. The electrical interconnect is typically comprised of individual electrical conductors supported by an insulating layer of polyimide and typically covered by a cover layer. Prior to the time that the HGA is installed into a disk drive, the electrical interconnect is electrically connected to the read and write elements, but is not connected to the drive electronics. As a result, the individual conductors that make up the electrical interconnect, can easily be charged by stray voltages, thereby creating a voltage potential across the sensitive MR or GMR read elements, which when discharged results in damaging current transients through the read element.

The components shown in FIG. 1 as well as all those associated with hard disk drives are small and continually decreasing in size. Consequently, any tolerance for ESD/EOS damage of the components during the assembly process is also continuously decreasing while their susceptibility to damage during assembly is increasing.

As noted, an ESD can actually damage or destroy circuit pathways in small electronic parts, such as an MR head, requiring the head to be discarded. The industry has been so concerned about this costly manufacturing problem that numerous patents have issued addressing the problem, including but not limited to U.S. Pat. No. 5,867,888 for Magnetic Head/Silicon Chip Integration Method; U.S. Pat. No. 5,855,301 for Electrostatic Grounding System for a Manually Operated Fluid Dispenser; U.S. Pat. No. 5,843,537 for Insulator Cure Process for Giant Magnetoresistive Heads; U.S. Pat. No. 5,837,064 for Electrostatic Discharge Protection of Static Sensitive Devices Cleaned with Carbon Dioxide Spray; U.S. Pat. No. 5,812,357 for Electrostatic Discharge Protection Device; U.S. Pat. No. 5,812,349 for Magnetic Head Apparatus Including Separation Features; U.S. Pat. No. 5,761,009 for Having Parastic [sic] Shield for Electrostatic Discharge Protection; U.S. Pat. No. 5,759,428 for Method of Laser Cutting a Metal Line on an Mr Head; U.S. Pat. No. 5,757,591 for Magnetoresistive Read/Inductive Write Magnetic Head Assembly; Fabricated with Silicon on Hard Insulator for Improved Durability and Electrostatic Discharge Protection and Method for Manufacturing Same; U.S. Pat. No. 5,757,590 for Fusible-Link Removable Shorting of Magnetoresistive Heads for Electrostatic Discharge Protection; U.S. Pat. No. 5,748,412 for Method and Apparatus for Protecting Magnetoresistive Sensor Element from Electrostatic Discharge; U.S. Pat. No. 5,742,452 for Low Mass Magnetic Recording Head and Suspension; U.S. Pat. No. 5,732,464 for Method of Facilitating Installation or Use of an Electromechanical Information-Storage Device Drive Assembly; U.S. Pat. No. 5,710,682 for Electrostatic Discharge Protection System for Mr Heads; U.S. Pat. No. 5,699,212 for Method of Electrostatic Discharge Protection of Magnetic Heads in a Magnetic Storage System; U.S. Pat. No. 5,686,697 for Electrical Circuit Suspension System; U.S. Pat. No. 5,654,850 for Carbon Overcoat with Electrically Conductive Adhesive Layer for Magnetic Head Sliders; U.S. Pat. No. 5,650,896 for Low Cost Plastic Overmolded Rotary Voice Coil Actuator; U.S. Pat. No. 5,644,454 for Electrostatic Discharge Protection System for Mr Heads; U.S. Pat. No. 5,638,237 for Fusible-Link Removable Shorting of Magnetoresistive Heads for Electrostatic Discharge Protection; U.S. Pat. No. 5,589,777 for Circuit and Method for Testing a Disk Drive Head Assembly Without Probing; U.S. Pat. No. 5,491,605 for Shorted Magnetoresistive Head Elements for Electrical Overstress and Electrostatic Discharge Protection; and U.S. Pat. No. 5,465,186 for Shorted Magnetoresistive Head Leads for Electrical Overstress and Electrostatic Discharge Protection During Manufacture of a Magnetic Storage System.

The foregoing patents generally evidence four different methods for reducing or eliminating ESD damage to MR heads, each relying upon the minimization of the voltage potential across the read elements or dissipation of the static electric charge—that is, the creation of an electrical short—and not the prevention of its buildup in the first instance. These methods include the use of mechanical clips, solder bridges, conductive tape, or a tear-away or sheared etched electrical shunt that is manufactured into the HGA by vapor deposition and etching or some other process. While each of these methods has met with some success, each has its own particular disadvantages. For example, mechanical clips are relatively expensive and also require a substantial amount of manual labor to attach them to the electrical interconnect; solder bridges are difficult to attach and then remove without causing damage to sensitive parts, can be a source of contamination in the drive, and also require manual labor for solder application and removal; conductive tape is expensive and requires manual labor for application; and tear away shunts require expensive apparatus, prohibit the electrical interconnect manufacturer from performing badly needed in-process continuity checks on the electrical interconnect, and is intentionally designed as a one-time shunt.

There are disadvantages that are shared by all of the above methods. First, each method is essentially a one-time application of an electrical short. That is, each of these methods relies upon a one-time placement and subsequent removal of the electrical short. Preferred manufacturing and quality testing operations, however, may require the successive application and removal of electrical shorts. For example, prior to in-process read/write head characterization, the electrical interconnect must be de-shunted, and then re-shunted after the head characterization to prevent ESD damage later in the manufacturing process. Yet, as noted, most of the foregoing methods of providing shunts are limited in their ability to be reapplied. This inability to repeatedly create and remove electrical shorts as desired is a critical limitation in present manufacturing operations. In addition, the very act of placing and, particularly, removing the electrical short can cause the very ESD sought to be avoided and, therefore, the damage that the short was to prevent in the first instance.

Further, each of the foregoing methods relies upon a physical engagement with the critical components of the MR head with at least one and sometimes two or more physical contacts, at least with the shunt itself and also, depending upon the shunting method used, with the tool applying the electrical shunt itself to the head. Each of these engagements and disengagements carries with it the potential for damaging the head.

Broadly stated, it would be desirable to have a method of creating and removing electrical shorts as desired in sensitive electronic components that did not depend upon a physical application of a conductive circuit to the component. More specifically, it would be desirable to have a method of creating and removing an electrical short to prevent ESD/EOS damage in an MR head when desired and any number of times desired.

SUMMARY OF THE INVENTION

It is an object of the present invention to provide new and improved apparatus that is not subject to the foregoing disadvantages.

It is another object of the present invention to provide a method of repeatedly providing and removing electrical shunts to reduce or prevent ESD/EOS damage.

It is still another object of the present invention to provide a method of using radiant energy to create and remove electrical shunts to reduce or prevent ESD/EOS damage.

It is yet another object of the present invention to provide a method of using a laser beam of a first fluence to create a shunt on the interconnect of the HGA and of using a laser beam of a second fluence to ablate the shunt.

It is another object of the present invention to provide a method of applying a laser beam to the interconnect of the HGA to create a conductive pathway for the dissipation of static electrical charges.

It is still yet another object of the present invention to carbonize a polymeric component of the electrical interconnect of an MR head to create a shunt and to ablate the carbonized surface layer to remove the shunt. The foregoing objects of the present invention are provided by a method for the substantially at-will creation of conductive pathways for the dissipation of static electric charges and the subsequent at-will removal of such pathways. The method includes the steps of providing an interconnect that is either electrically connected or to be subsequently electrically connected to at least one component subject to damage from ESD/EOS; providing a conductive pathway on the interconnect; removing the conductive pathway when the ESD/EOS protection is no longer desired or required; and, if desired, re-establishing and reremoving a new conductive pathway on the interconnect. In one embodiment of the present invention, the conductive pathway is provided by exposing the interconnect's polymeric substrate to a radiant energy source. In another embodiment of the present invention the conductive pathway is removed by exposing the conductive pathway of the interconnect's polymeric substrate to a radiant energy source, which may be the same energy source as used to establish the conductive pathway in the first instance but operated according to different parameters such that the fluence of the radiant energy source is changed between the establishment and the removal of the conductive pathways. The fluence may be changed by increasing the operating power of the energy source, by focusing and defocusing the radiant energy source to alternately concentrate and disperse the energy as desired, or through the use of the appropriate filter. In one embodiment of the present invention a laser beam may be used to create the conductive pathway.

The present invention further provides a method whereby a radiant energy source may be used either to carbonize a surface layer of a substrate supporting at least one electrical component or to carbonize the polymeric material that engages at least one surface of a pair of conductors. The carbonized surface layer of the substrate or of the cover layer provides an electrical pathway for the controlled dissipation of static electric charges rather than a damaging discharge (either high current transients, or a spark). When it is desired to remove the shunt, a radiant energy source can be used to ablate the carbonized surface, thereby removing the conductive pathway. Lasers can be used both to carbonize the polymeric surfaces of an interconnect to create the conductive pathway and to ablate the pathway when desired.

The present invention also provides for interconnects in accord with the present invention. Such interconnects include at least two conductive wires or leads engaged on at least one surface by a carbonizable and ablatable material. The conductive wires may each include a branched dead end lead portion interleaved with the branched dead end lead portion of the other. In one embodiment of the present invention the dead end branched portions may be electrically connected to the leads by adjacent short leads that may be ablated or otherwise removed to electrically isolate the dead end leads and to substantially prevent any electrical interference with the operation of the interconnect. Alternatively, the conductive wires may extend in close proximity to each other in a curved or sinuous or serpentine or backtracking pattern. An interconnect in accord with the present invention may include a substrate substantially supporting the conductive wires except at predetermined locations or proposed shunt sites wherein there is at least one through hole in the substrate or the cover layer of the substrate or both.

The foregoing objects of the invention will become apparent to those skilled in the art when the following detailed description of the invention is read in conjunction with the accompanying drawings and claims. Throughout the drawings, like numerals refer to similar or identical parts.

BRIEF DESCRIPTION OF THE DRAWINGS

FIGS. 8A and 8B illustrate an embodiment of an interconnect in accord with the present invention showing a cover layer over electrical traces supported on a substrate.

FIGS. 12A and 12B depict an another embodiment of an interconnect in accord with the present invention that includes a trace pattern having serpentine or interleaved trace patterns.

FIGS. 13A and 13B show in a perspective view another embodiment of an interconnect in accord with the present invention that includes a dual layer trace pattern.

FIGS. 22A–22C illustrate in flow chart form the basic steps common in the fabrication of component parts and assembly thereof into a hard disk drive.

DETAILED DESCRIPTION OF THE INVENTION

Figure 2:
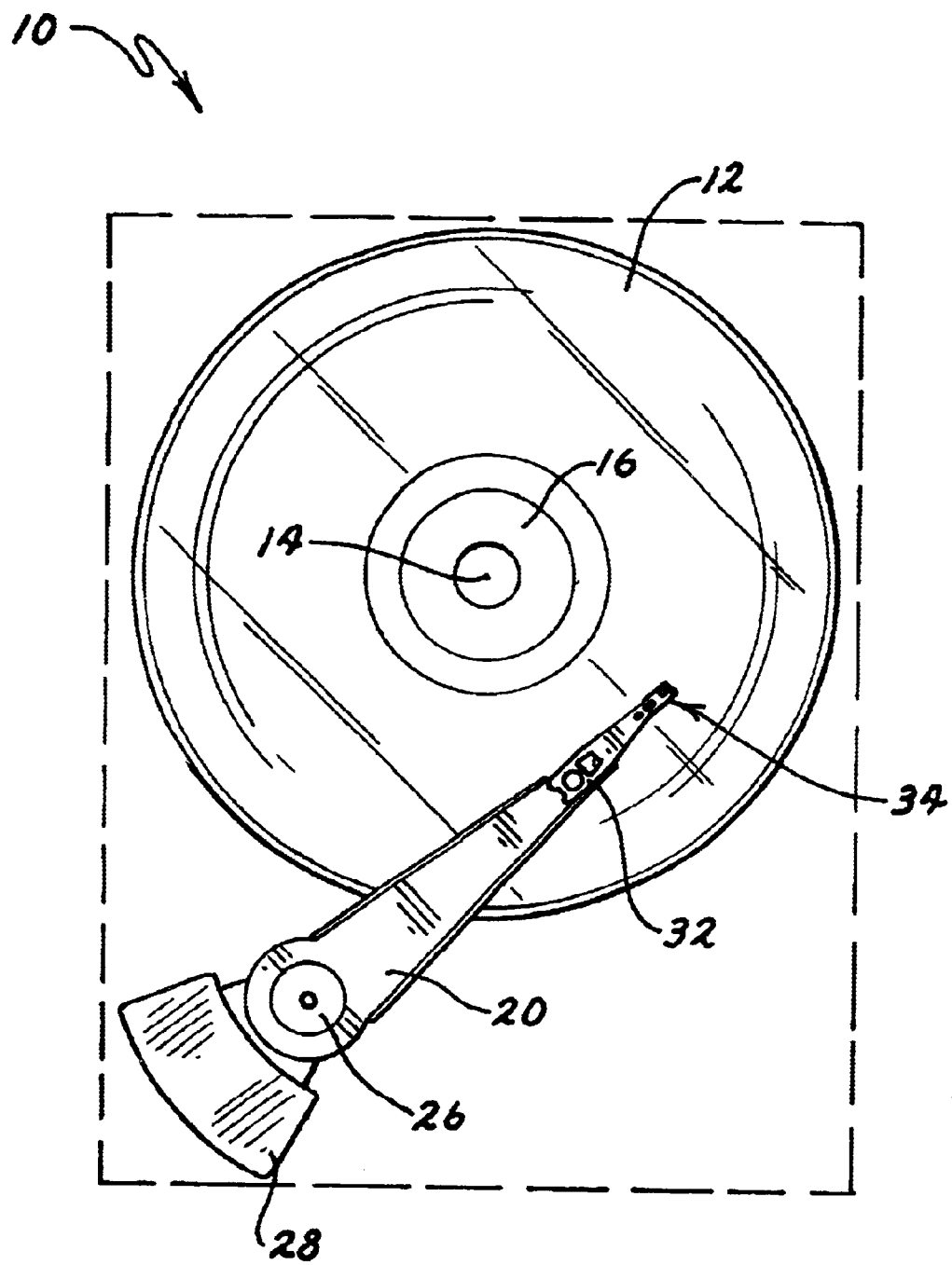
FIG. 2 is a top plan view of a hard disk drive.
Figure 3B:
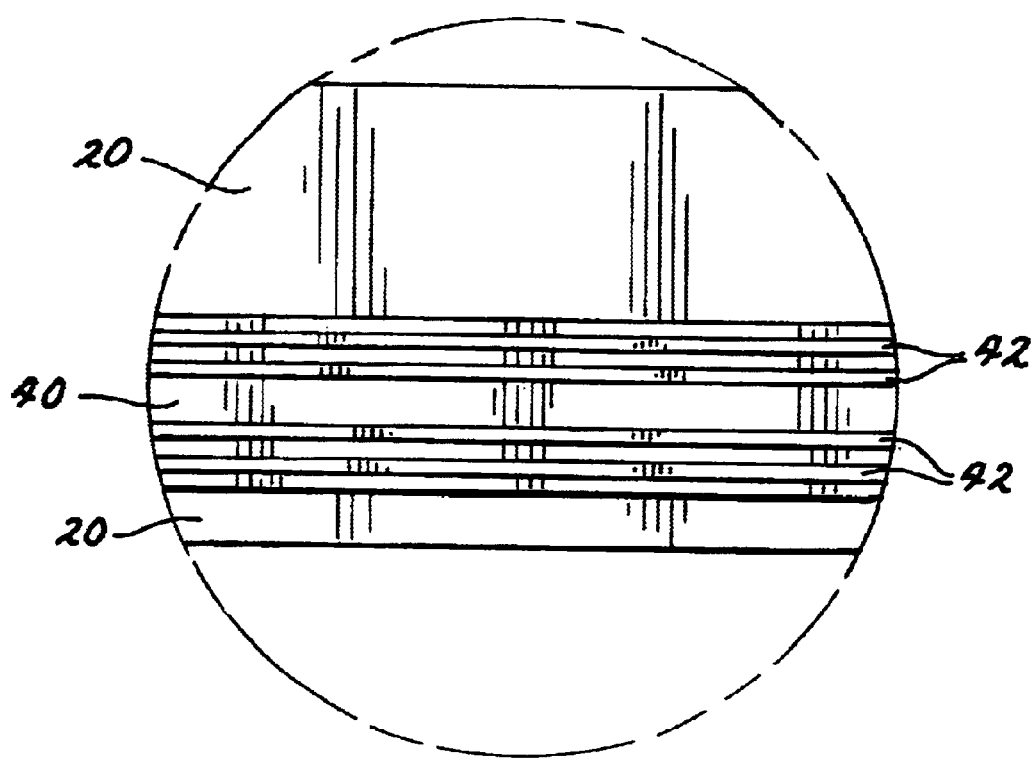
FIG. 3B is an enlarged view of the area shown in the phantom circle in FIG. 3A.
Figure 3A:
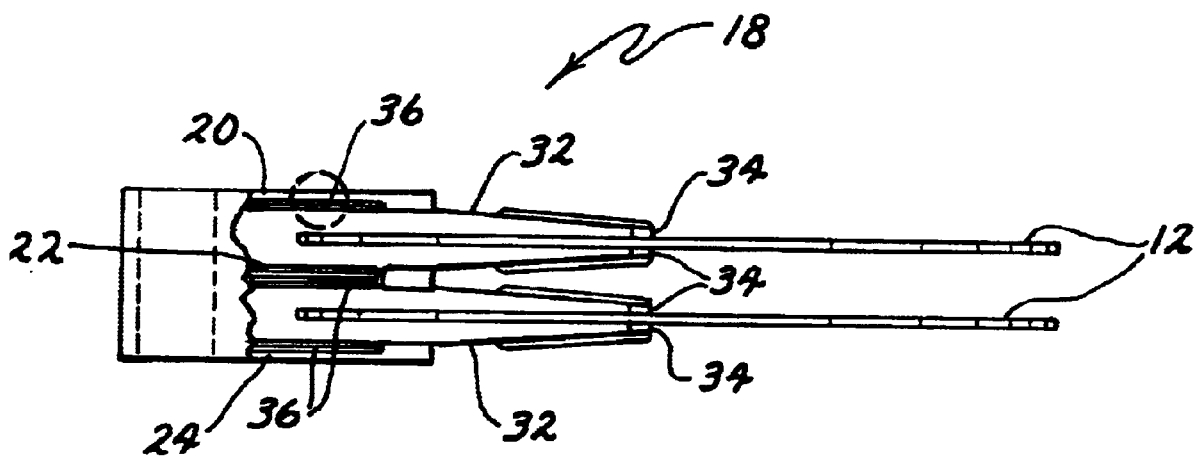
FIG. 3A is a side elevation, partial view of a hard disk drive, such as that shown in FIG. 1.

FIGS. 2, 3A and 3B illustrate a hard disk drive 10 in a top plan, highly schematic view. It will be understood that many of the components found in such a disk drive 10, such as a memory cache and the various controllers are not shown in the figure for purposes of clarity. As illustrated, drive 10 includes at least one, and typically several, disks 12 mounted for rotation on a spindle 14, the spindle motor and bearing not being shown for purposes of clarity. The disks 12 each include at least one surface for reading and writing data thereon, though typically both surfaces of the disk will be used for such a purpose. A disk clamp 16 is used to position and retain the disk 12 on the spindle 14. The disk drive 10 further includes an "E" block 18, best seen in FIG. 2. The E block 18 gets its name from its shape as viewed from the side. It will be observed that E block 18 includes a plurality of actuator arms 20, 22, and 24, which are supported for pivotal motion by an actuator pivot bearing 26. A voice coil motor assembly 28 is used to control the pivoting motion of the actuator arms 20–24.

Each actuator arm 20–24 includes a head gimbal assembly 30 comprising a suspension 32, a read/write head/slider 34, and interconnect 36 that extends from the head/slider to the actuator flex 38. The dashed circle shows an expanded view of the arm 20, which includes a substrate 40 (wherein the bracket indicates the lateral extent of the substrate relative to the actuator arm 20 in this particular embodiment) upon which electrical leads or traces 42 are supported. The electrical conductors 42 are typically copper or copper alloy with a gold plating.

The substrate 40 will substantially underlie the traces 42. Substrate 40 may comprise a synthetic material such as polyimide, which may be of the type sold under the brand name Kapton® by I.E. DuPont. Polyimide, as is well known, is an organic polymer.

Figure 1:
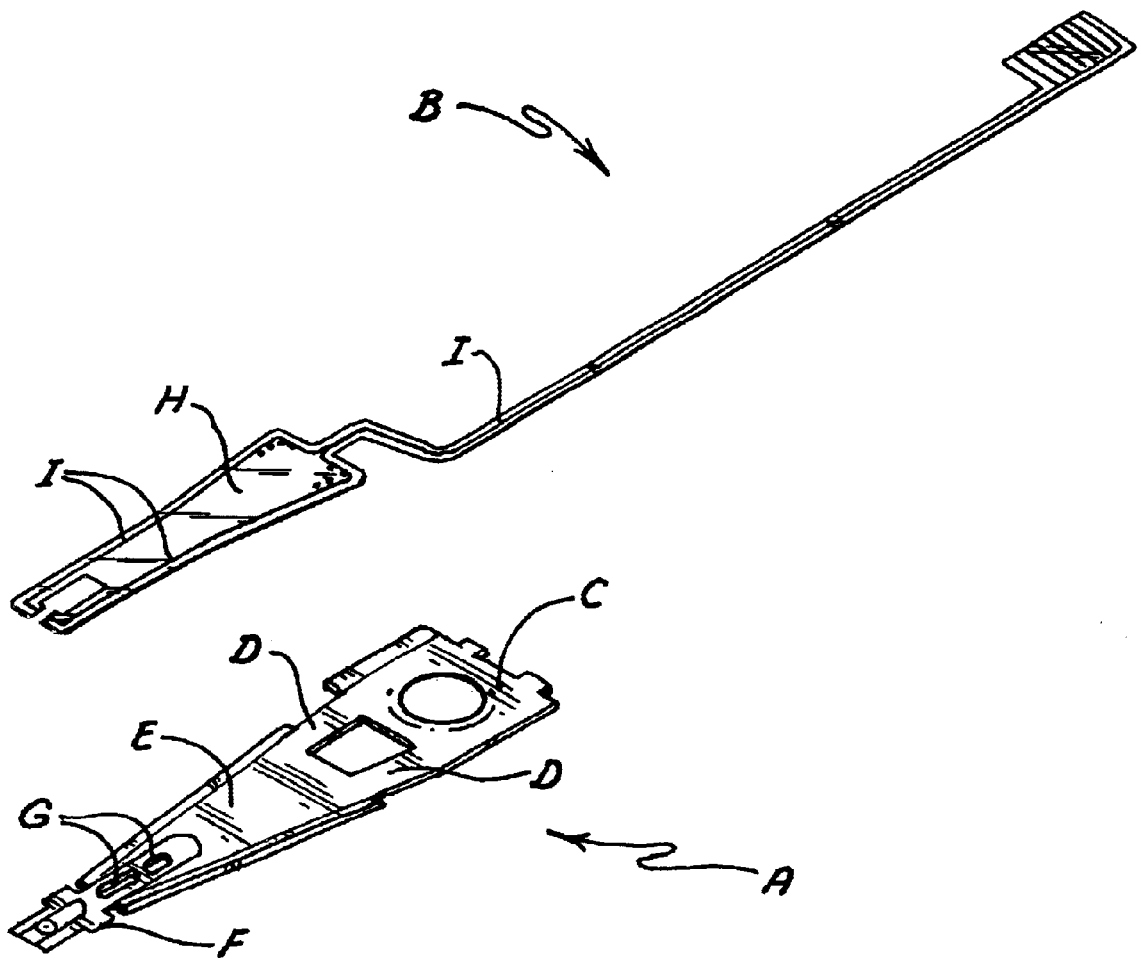
FIG. 1 is an illustrative, exploded, perspective view of a typical suspension/interconnect assembly.
Figure 4:
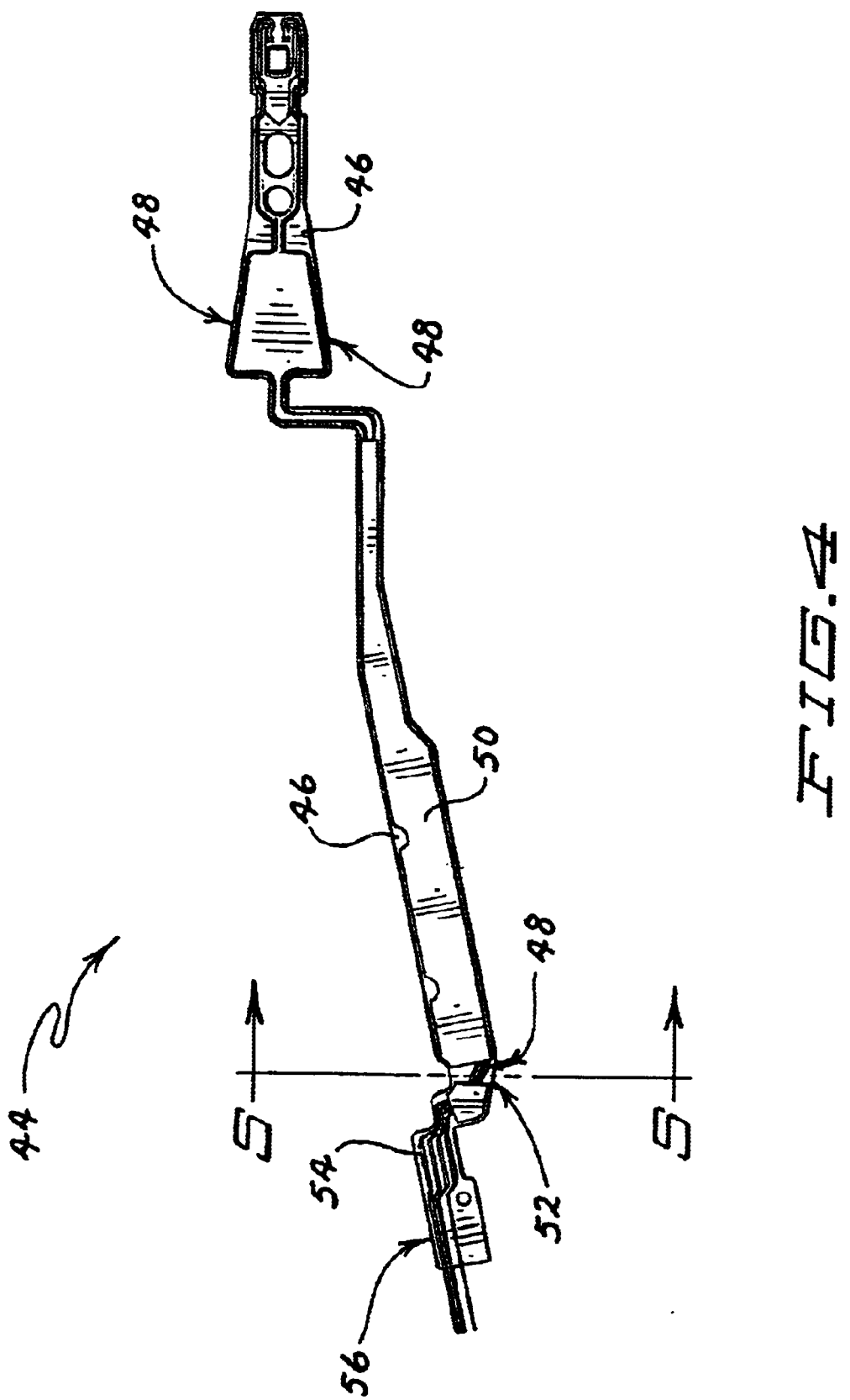
FIG. 4 is a top plan view of an interconnect.

FIG. 4 illustrates in a perspective view an interconnect assembly 44 of the type in which the present invention may find admirable use. Assembly 44, like that shown in FIG. 1, may have varying configurations depending upon the manufacturer. Assembly 44 includes a substrate 46 and a plurality of traces or leads 48. The assembly 44 may also include a cover layer 50. Also shown is a window or gap 49a in the cover layer where the present invention may find application, though the present invention may find application generally throughout the length of the assembly 44. The assembly 44 further includes termination pads 54 and may include test pads 56 in the general area indicated. Typically, that portion including the test pads 56 will be torn away or removed after testing is complete. The view taken along cross-section viewing plane 5—5 is shown partially in FIG. 5.

Figure 5:
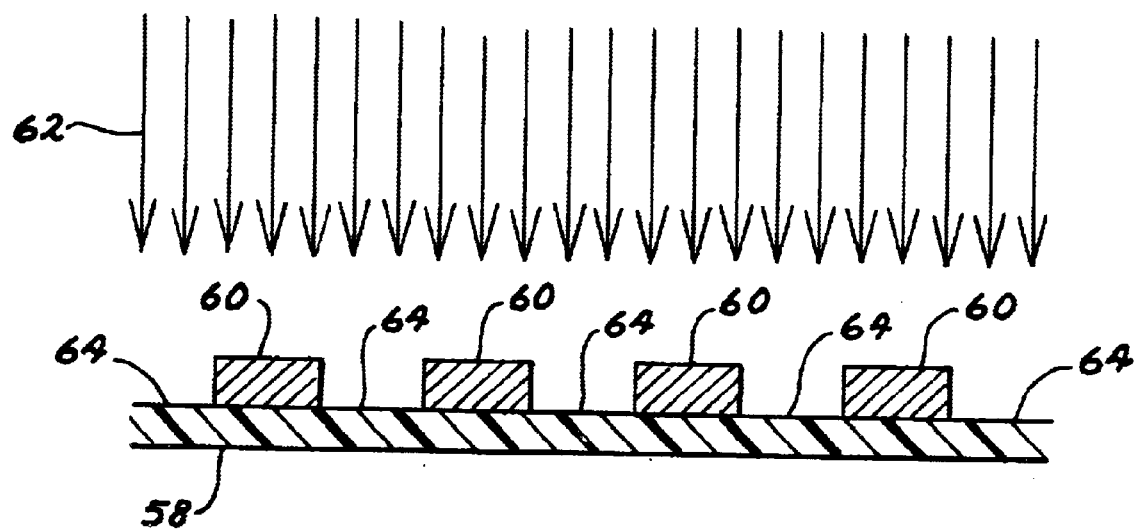
FIG. 5 is an enlarged sectional view of an interconnect shown in FIG. 4 taken along viewing plane 5—5.

Referring now to FIG. 5, the present invention will be described in broad detail. FIG. 5 illustrates a cross-sectional view of a substrate 58, which may be the substrate 40, supporting a plurality of spaced apart electrical leads or traces 60, which may be leads 42. Leads 60 are conductive and may comprise copper wires or other suitably conductive material. As indicated, a radiant energy source 62, such as ultra violet light produced by a laser, is applied to the substrate 58 and leads 60. The fluence of the radiant energy is preferentially chosen such that its application to the substrate 58 results in the "charring" or carbonization of the exposed surface 64 while leaving the leads 60 unaffected. The carbonized surface layer 64 is conductive, and thus provides a safe, discharge pathway for any static charges that may build up on an interconnect or suspension during assembly. Stated otherwise, with the present invention, the electrical interconnect is shunted, or shorted, by creating a conductive layer on the substrate surface between adjacent conductors at a site along the electrical interconnect. In one embodiment of the present invention, when a polyimide substrate surface at the desired shunt location site is irradiated with ultraviolet laser light pulses at the proper fluence level, a conductive surface layer, mainly composed of carbon, is formed. This conductive surface layer provides an electrical connection between adjacent conductors of the electrical interconnect. In addition, by increasing the fluence of the applied radiation, the carbonized surface layer 64 can also be removed, thereby removing the conductive layer and thus removing the shunt.

The carbonized layer produced on a polyimide substrate can exhibit resistivities as low as 0.05 ohm-cm, depending upon the carbon density of the created layer. The carbon density of the created conductive surface layer increases with increased pulses of radiant energy and increased fluences, as long as such fluences remain below the ablation threshold.

The present invention, then, provides a method for readily creating and removing a shunt that is completely devoid of any physical contact of the type that either can generate static electrical buildups in the first instance or can cause a discharge in a non-controlled manner. The conductive layer 64 is created by a non-contact application of a radiant energy, such as ultraviolet electromagnetic radiation, which may be created using known laser technology, and can be erased, cleaned, obliterated, or otherwise removed from the substrate as desired. This method enables the assembler of a hard disk drive or other electronic component to create and remove an ESD protecting shunt as desired at least once and typically a plurality of times. In this manner, then, the shunts can be applied, removed, reapplied and re-removed as desired, thereby maintaining a protective shunt in place at all times except when such a shunt would interfere with normal assembly or test procedures, such as when a dynamic electrical test of the read/write head is conducted. The shunting and de-shunting procedures can be repeated at the same site along the electrical interconnect, or, if desired, at a different site. For shunting purposes, the size of the irradiated site should be considered in determining how to provide adequate conductivity between conductors. A larger irradiated site length will provide lower resistance and better shunting performance.

Suitable radiant energy sources include excimer lasers or solid-state lasers; it being understood, however, that any other radiant energy source capable of preferentially carbonizing the surface of a polymeric material may find employment with the present invention.

More generally, the present invention can be used wherever it is desired to create a shunt between at least two spatially separated, that is, otherwise electrically insulated, electrically conductive components at least partially engaging a common carbonizable insulator, including but not limited to a polymeric substrate or base or cover layer. A source of radiant energy can be used to apply radiant energy to the common substrate or base to create a carbonized surface layer interconnecting the electrically conductive components that will function as an electrical conductive pathway between them. The surface conductive path can be removed as desired using a higher fluence radiant energy source.

Additionally, the present invention can be used wherever it is desired to create a shunt between at least two spatially separated, that is, otherwise electrically insulated, electrically conductive components having at least one surface engaged by a common polymeric overlay. A source of radiant energy can be used to apply radiant energy to the polymeric overlay to create a carbonized surface layer interconnecting the electrically conductive components that will function as an electrical conductive pathway between them. The surface conductive path can be removed as desired using a higher fluence radiant energy source. It will be understood that the present invention will also provide for the carbonization of any other polymeric materials that are disposed between adjacent conductors.

Figure 6A:
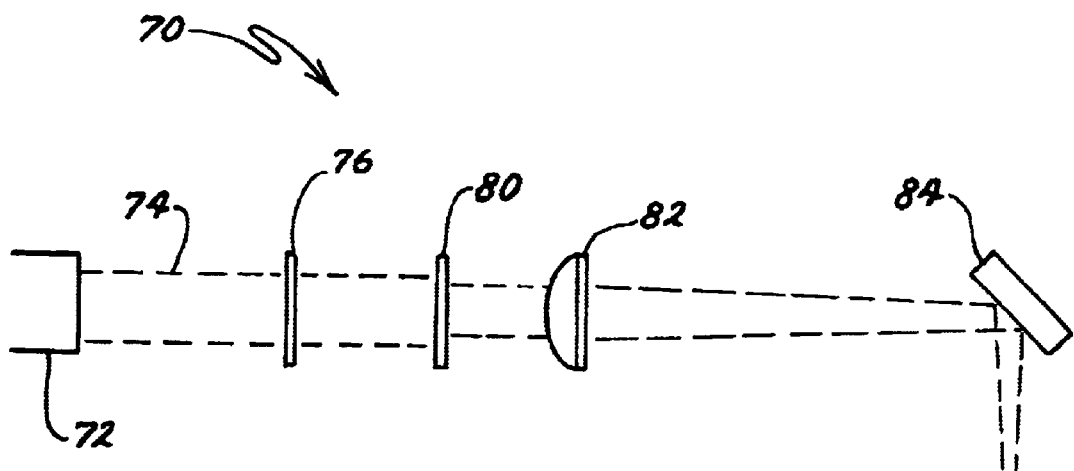
FIGS. 6A and 6B illustrate in schematic form an apparatus useful in practicing the present invention.
Figure 6B:
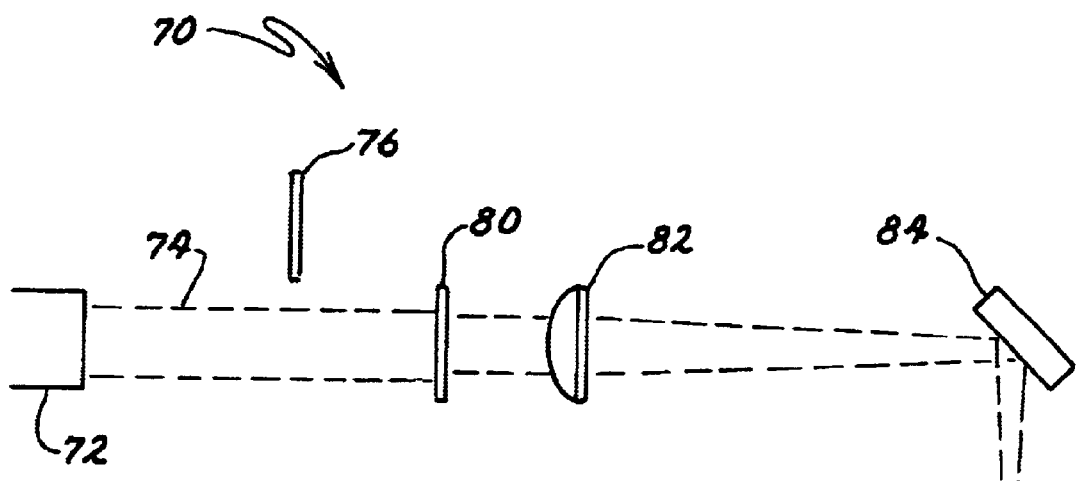

FIGS. 6A, 6B, 7A, and 7B will now be discussed. FIGS. 6A and 6B illustrate in schematic form an apparatus 70 useful in accord with the present invention. As shown, a radiant energy source, such as an ultraviolet laser, 72 provides a radiant beam 74 that is directed through a neutral density filter 76. The filter 76 operates to reduce the fluence of the beam 74 to a level that is optimal for creating a carbonized, conductive surface layer on the surface of a workpiece 78, which may be an interconnect for an HGA by way of example only. A mask 80 is disposed in the path of beam 74 to pattern the beam in the desired manner and thereby affect only those portions of the workpiece desired to be affected. The beam 74 is then directed through a focusing means 82 such as the plano-convex lens illustrated in the drawing and subsequently reflected off a mirror 84, which may be a 45° ultraviolet-grade mirror, onto the workpiece 78 to produce a carbonized surface. The apparatus 70 can thus be advantageously used to produce a shunt for an interconnect as previously described.

Referring specifically to FIG. 6B, when the removal of the carbonized surface layer is desired, that is, when it is desired to remove the shunt previously created, the filter 76 can be removed from the path of the beam 74, thus allowing the full fluence of the beam 74 to be applied to the workpiece 78.

Figure 7A:
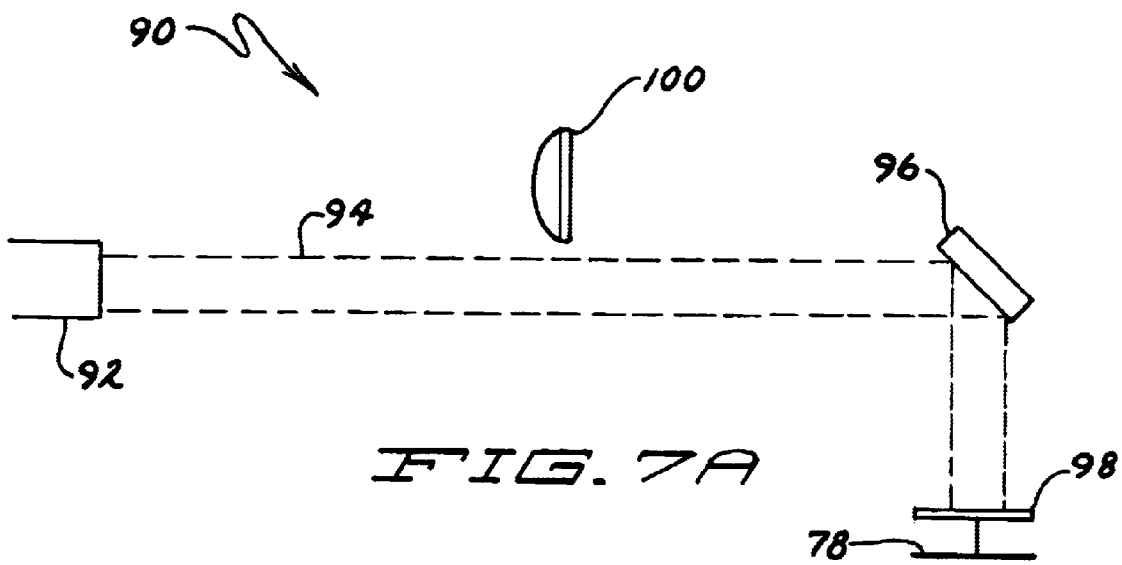
FIGS. 7A and 7B illustrate in schematic form another apparatus useful in practicing the present invention.
Figure 7B:
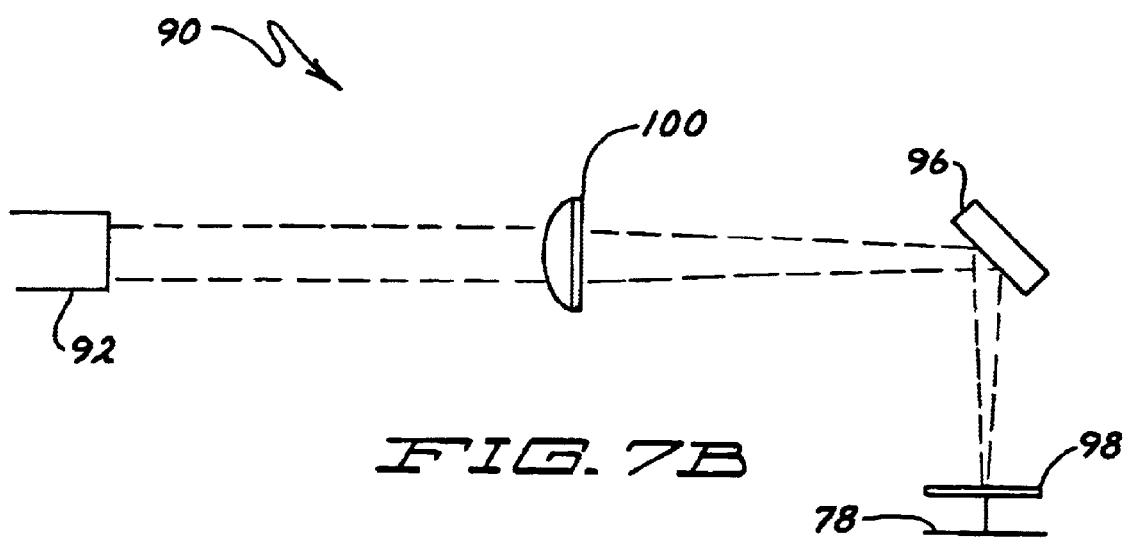

FIGS. 7A and 7B illustrate in schematic form another apparatus 90 useful in accord with the present invention. As shown in the Figures, a radiant energy source, such as an ultraviolet laser, 92 provides a radiant beam 94 that is reflected off a mirror 96, which may be a 45° ultraviolet-grade mirror, through a mask 98 to control the size and pattern of the beam applied to the workpiece 78 to produce a carbonized surface. The full fluence of the beam 94 is thus applied directly to the workpiece. As with the apparatus 70, the apparatus 90 can thus be advantageously used to produce a shunt for an interconnect as previously described.

Referring now to FIG. 7B, when the removal of the carbonized surface layer is desired, that is, when it is desired to remove the shunt previously created, a focusing means 100, such as the plano-convex lens shown in the figure, can be placed in the path of the beam 94, thereby concentrating the full fluence of the beam 94 to increase its fluence at the workpiece 78 to a level sufficiently high to ablate the carbonized surface previously produced on the workpiece 78.

It is well understood that certain laser beams do not produce a uniform fluence across the beam area. Therefore, with certain laser beams it may be necessary to include a homogenizer to provide a uniform beam.

It has been found that a carbonized surface can be produced on a polyimide substrate where the fluence level of the applied laser beam is about 60 millijoules per square centimeter (mJ/cm$^2$) and that the carbonized surface can be ablated or otherwise removed at a fluence level of about 140 mj/cm$^2$. Thus, in FIG. 6A, the radiant energy source 72 would produce a raw beam having a fluence level of about 140 mj/cm$^2$, which is subsequently moderated by the filter 76 to a fluence level of about 60 mj/cm$^2$ while the radiant energy source 92 of FIGS. 7A and 7B would produce a beam having a raw power level of 60 mj/cm$^2$ which is subsequently concentrated by the focusing means 100 to produce a power level of 140 mJ/cm$^2$. Other fluence levels can also be used to create and remove shunts on polyimides in accord with the present invention. Additionally, other materials used to support and insulate the leads may require other fluence levels.

Referring now to FIGS. 8A and 8B, an interconnect 110 useful in accord with the present invention is shown in a partial perspective view. Interconnect 110 includes a substrate 112 supporting a plurality of electrical leads 114 and a cover layer 116 comprising an overcoated polymer. Cover layer 116 can be in the form on one or more segments, with adjacent segments defining therebetween a "potential shunting sector," that is, an area or window 118 of the interconnect 110 that will be subject to shunting and deshunting. Also shown in the Figure are electrical contacts 120.

As seen in FIG. 8B, a shunt 122 can be created by exposing a portion of the substrate 112 and cover layer 116 to a radiant energy source to carbonize the surface layer of both. When the carbon layer 122 is ablated, that is, the shunt 122 is removed, then the overcoat layer 116 will act as a barrier to assure that the edges of the energy stream do not create further carbonization and in effect, reshunt the electrical leads as the previously applied shunt is being ablated.

Figure 9:
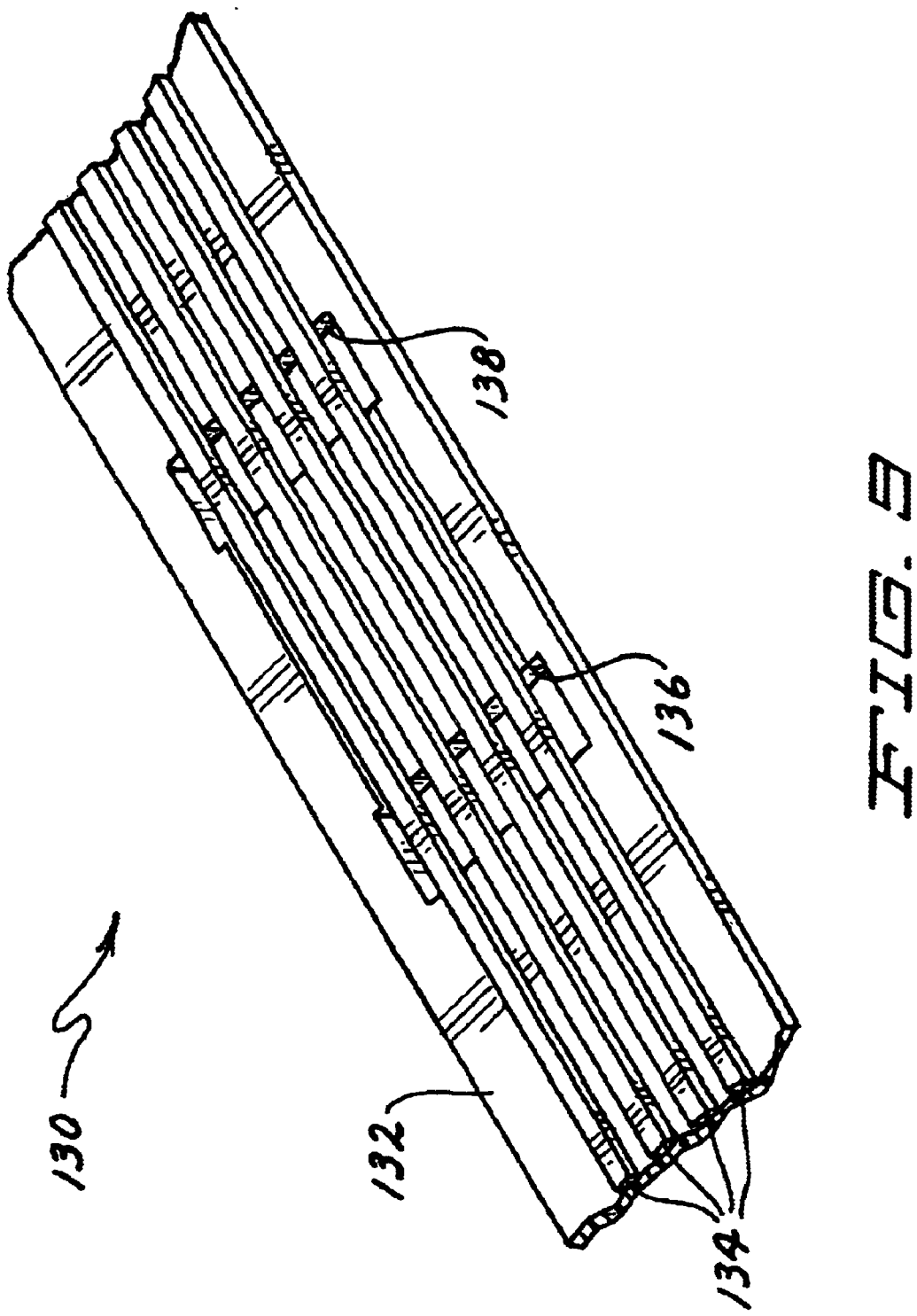
FIG. 9 illustrates another embodiment of an interconnect in accord with the present invention wherein the substrate includes a plurality of through holes.
Figure 10A:
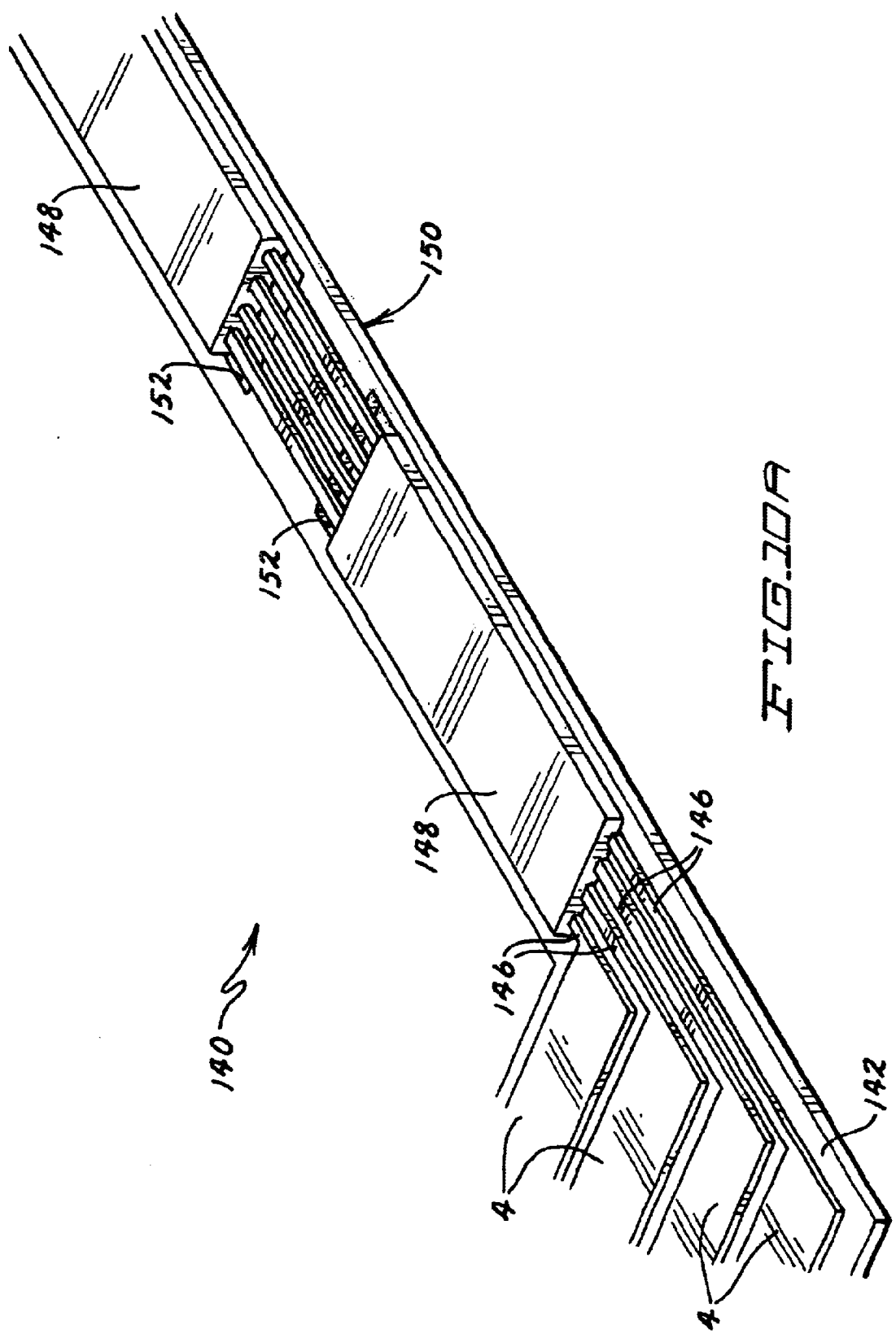
FIGS. 10A and 10B are obverse and reverse views of an interconnect in accord with the present invention wherein the substrate includes a plurality of through holes.
Figure 10B:
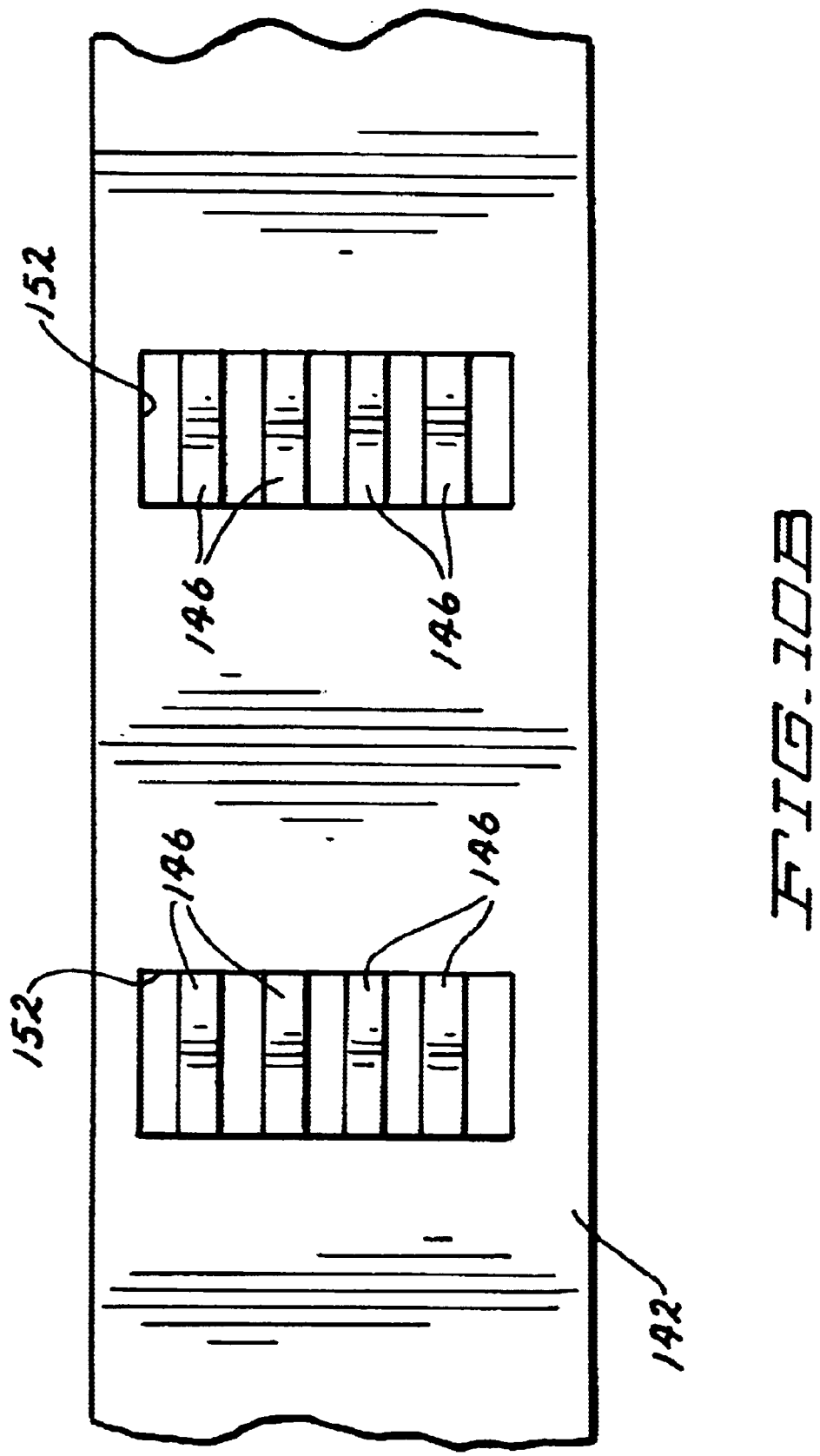

FIG. 9 illustrates another embodiment of a portion of an interconnect in accord with the present invention. FIG. 9 illustrates an interconnect 130, which includes a substrate 132 supporting a plurality of electrical leads 134 and a plurality of through holes 136 and 138. The through holes 136 and 138 define the limits of the potential shunt and deshunt area. That is, the through holes 136 and 138 prevent the formation of a surface conductive layer between the traces 134 since the substrate has been removed as a support. The through holes 136 and 138 thus function similarly to the cover layer 116, yet avoid the need to lay down the over coat. Referring now to FIGS. 10A and 10B, another embodiment of the present invention, which advantageously incorporates the features of the embodiments of FIGS. 8A, 8B and 9, will be described. FIGS. 10A and 10B illustrate an interconnect 140, which includes a substrate 142 supporting a plurality of 20 electrical contacts 144, corresponding leads 146, and a cover layer 148 comprising an overcoated polymer. Cover layer 148 can be in the form on one or more segments, with adjacent segments defining therebetween a "potential shunting sector" or shunting window 150. As seen in FIGS. 10A and 10B, the substrate 142 includes a plurality of through holes 152. These through holes define the limits of the substrate area subject to shunting and deshunting. That is, the through holes 152 prevent the formation of a surface conductive layer between the traces 146 since the substrate has been removed as a support.

Figure 11:
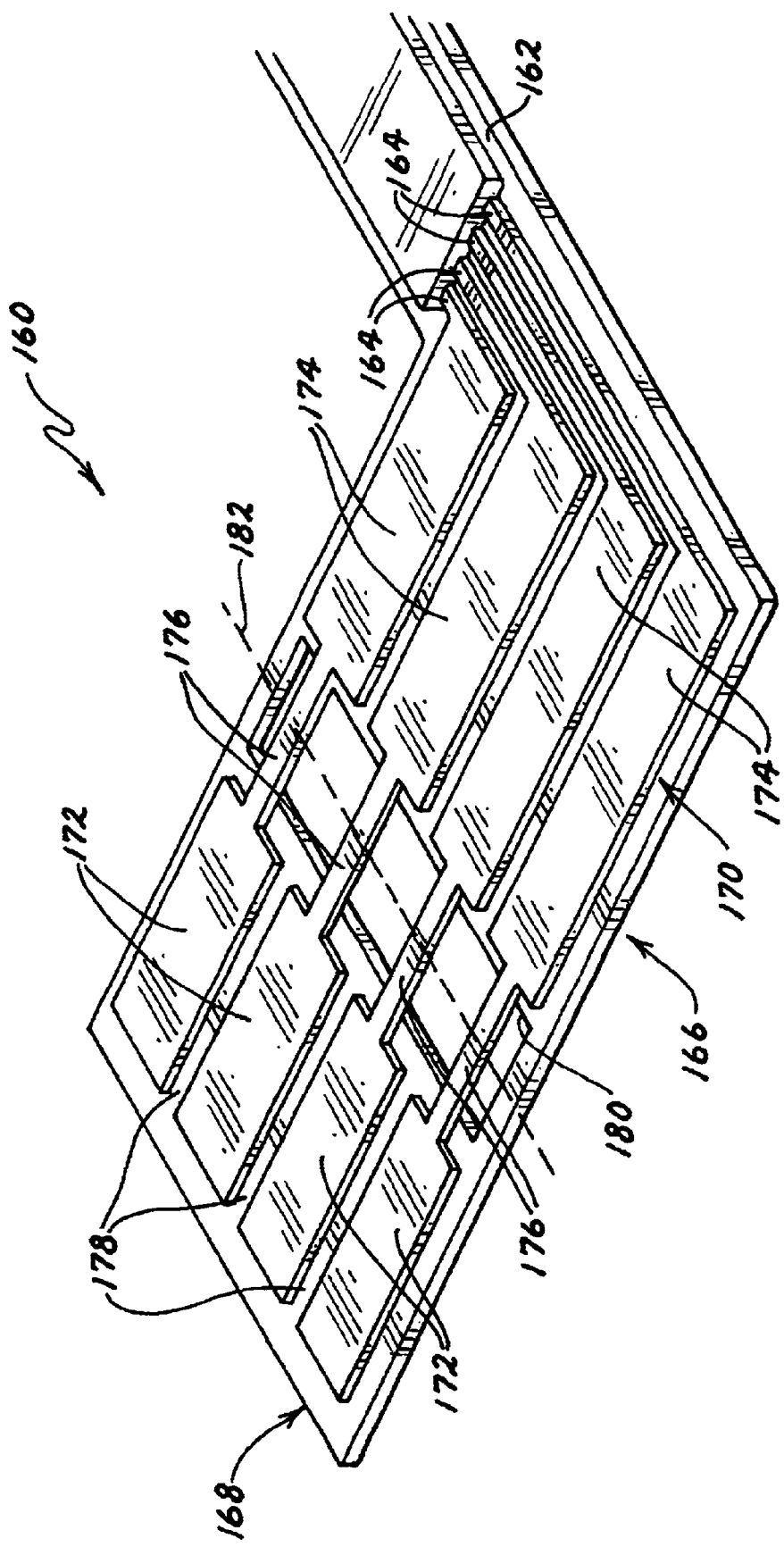
FIG. 11 illustrates in a perspective view another embodiment of an interconnect in accord with the present invention that includes a multiply-shuntable, tear-away or shearable portion.

Another embodiment 160 of an interconnect in accord with the present invention is illustrated in FIG. 11. The interconnect 160 includes a substrate 162 that supports a plurality of leads 164. It will be observed that the interconnect 160 includes a terminal end 166 defining a tear-away or shearable portion 168 and an electrical connect portion 170. Terminal end 166 includes a plurality of temporary, tear away or shearable shunt electrical pads 172 and a corresponding plurality of permanent electrical connection pads 174 electrically connected by a similar corresponding plurality of tear-away or shearable leads 176. Like the connection pads 174, the shunt electrical pads 172 are supported upon a substrate that produces a conductive surface area when exposed to a radiant energy source. Thus the surface areas 178 between the shunt pads 172 can be made electrically conductive. The terminal end 166 also includes a through hole 180 underlying the tear-away leads 176. Thus, with this embodiment, the areas 178 can be shunted and deshunted in the manner hereinbefore described. When the shunt is no longer required, the tear-away portion 168 can be severed from the portion 170, for example, along the dotted line 188. In this manner, then, the entire tear-away portion can be removed from the finished product and no trace of the shunting/deshunting operation will remain.

With the foregoing invention, the thin, carbon surface layer produced on the interconnect has a high resistivity. It is desirable, however, to minimize the resistance between adjacent conductors, such that the majority of a current transient resulting from an ESD event passes through the shunt, rather than the ESD sensitive device. One manner of affecting the resistance is to vary the length being shunted and thus vary the resistance. Thus, increasing the length of the area (length of conductors exposed to the shunt) that forms the shunt will decrease the shunt's resistance.

This following equation describes the relation between the shunt resistance and other variables of interest:

$$R = \rho \frac{L}{WT}$$

where:
R=Resistance of shunt (ohms)
p=proportionality constant of the carbon layer (0.05 to 0.1 ohms-cm)
L=Distance between conductors (0.03 mm to 0.05 mm)
W=Length of conductors aligning the shunt
T=Thickness of the carbon layer (~50 nm).

As shown by this equation, the shunt resistance is inversely proportional to the length W of the conductors in the irradiated site and is directly proportional to the conductor spacing L.

With regards to MR heads, it is generally desirable to provide less total resistance in the shunt than in the read/write head (since current will follow the least resistance path). This can be accomplished by meandering the traces back and forth on themselves in a sinuous or serpentine manner since the increased length of the traces that are shunted results in a decrease in total shunt resistance. Therefore, the affected length of the traces due to the creation of the shunt by the radiant energy source can be longer than with normal non-serpentine traces. For example, normally the length of the traces shunted may be in the range of about 2 to about 4 mm while the length of the shunted traces may be substantially longer, say 30 mm, where a serpentine trace path is used. From the equation above, this results in a reduction in the shunt's resistance of one order of magnitude or a factor of 10.

Simply adding length to the traces is insufficient, however, since negative effects due to the length addition must be avoided. For example, if the length were to be increased in the zone between the actuator flex termination pads and the head, it would increase the trace length between the head and preamplifier, thus diminishing the read and write speed of the head. Positioning of the increased length due to the serpentine or sinuous patter is thus critical to achieving the desired increase in trace resistance without compromising the performance of the read/write head. For example, the serpentine pattern can be disposed past the actuator termination zone and even past the test pads. In that manner, this extra lead (trace) length won't affect drive read or write performance, nor will it impact performance during in-process electrical tests, such as dynamic electrical tests (DET).

FIGS. 12A and 12B illustrate another embodiment of an interconnect in accord with the present invention that takes advantage of an increased shunt length. FIG. 12A illustrates, then, a portion of an interconnect 190 having a serpentine trace pattern that provides the desired increased trace length without degrading the performance of the read/write head. Interconnect 190 includes a substrate 192. The substrate 192 includes a plurality of conductive contacts 194A–E that may overlay through holes in the substrate, which thereby allow electrical contact to be made from both sides of the interconnect 190. Contact 194A is the ground contact, while contacts 194B and 194C extend to and from the write head and contacts 194D and 194E extend to and from the read head. Leads 196 extend from each of the contacts 194A–E. Thus, a lead 196A extends from ground contact 194A to a ground termination (not seen). Furthermore, leads 196B and 196C extend from the write contacts 194B and 194C, respectively and extend to the electrical component to be protected, such as a write head. Leads 196D and 196E extend from the read contacts 194D and 194E, respectively, to form a serpentine pattern as indicated generally at 198.

The placement of the shunt across the serpentine read leads and the write leads effectively creates a plurality of resistors in parallel, thus lowering the overall resistance of the shunt relative to the leads. Thus, the present invention also provides a method for creating a plurality of parallel resistors useful as shunts to prevent damage due to ESD/EOS.

Referring now to FIG. 12B, another embodiment of an interconnect 200 useful for reducing the potential for damage due to ESD/EOS is shown. Interconnect 200 depicts a substrate 202 supporting a ground contact 204A, write contacts 204B, 204C and read contacts 204D, 204E. Leads 206A extend from contacts or pads 204A–6 respectively. Lead 206A extends from ground contact 204A. Leads 206B and 206C extend substantially linearly from contacts 204B and 204C respectively to the MR head. Lead 206D extends from read contact 204D towards the MR head and then branches into a plurality of individual leads 208. In the embodiment shown here, it will be observed that the leads 208 extend substantially parallel to each other, though the present invention does not require that the leads be parallel. Lead 206E extends from read contact 204E toward the MR head and branches into a plurality of leads 210 that are interleaved with leads 208. The shunt can be applied using the methods previously and hereafter described to the interconnect 200 substantially anywhere along the length of the traces or leads 206B–E, though doing so in the area of the interleaved leads 208 and 210 will provide the previously discussed advantage of lowering the resistance of the shunt relative to the leads.

In each of the FIGS. 12A and 12B a shunt 212 is shown in a dotted outline where it could be advantageously created. It will be understood that a shunt could be advantageously created at other locations and that the use of cover layers and through holes is also contemplated.

As used herein, "serpentine" is not intended to be limited in its scope to a strictly "back and forth" trace pattern as shown in FIGS. 12A and 12C. Rather, any trace or lead pattern that involves intertwining the leads or extending a plurality of leads from a single lead in an intertwined manner in close proximity to each other is within the scope of the present invention.

Figure 13B:
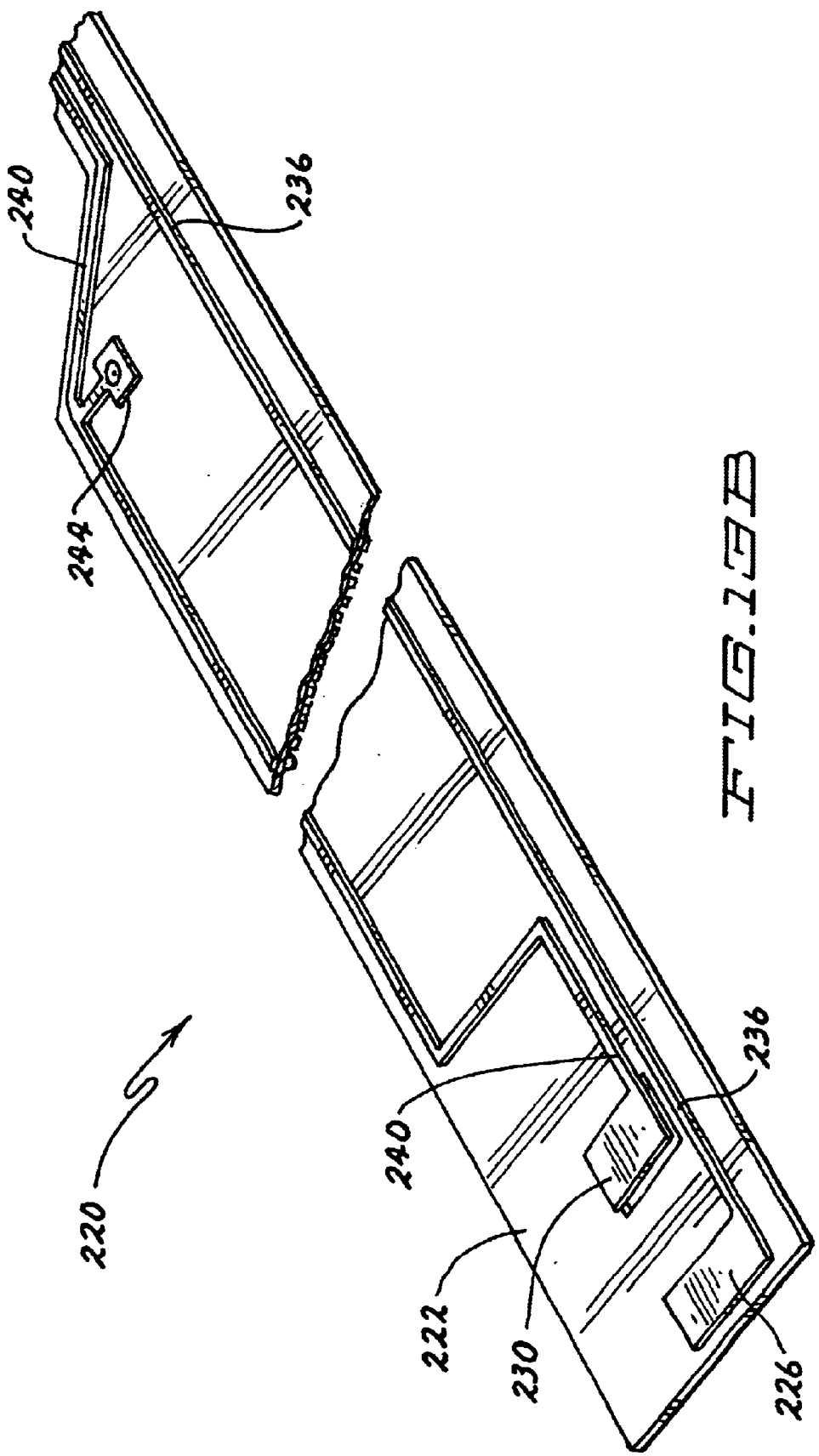

FIGS. 13A and 13B illustrate another embodiment of an interconnect 220 in accord with the present invention that includes a dual layer trace layout. In a dual trace interconnect, at least one of the read and/or write trace pair has one trace or lead on one side of the substrate and another trace on the other side. As seen in the Figures, interconnect 220 includes a substrate 220 supporting on opposing sides thereof at least a pair of write contacts 224 and 226 and a pair of read contacts 228 and 230. Contacts 226 and 230 each overlie a though hole 232 extending through the substrate 222, thereby allowing electrical contact to be made with all four contacts on one side of the substrate if desired. Write leads 234 and 236 extend from write contacts 224 and 226 respectively toward the MR head while leads 238 and 240 extend from read contacts 228 and 230 respectively. Lead 238 branches into a plurality of leads 242. Lead 240 extends to a plated through hole 244 which in turn branches into a plurality of leads 246 that are interleaved with leads 242. The plated through hole 244 therefore provides conductivity between the obverse and reverse sides. Creating the shunt 248 shown in phantom, then, across the interleaved leads 242 and 246, then will provide the same form of ESD/EOS protection as that provided in FIGS. 12A–12C.

Figure 14:
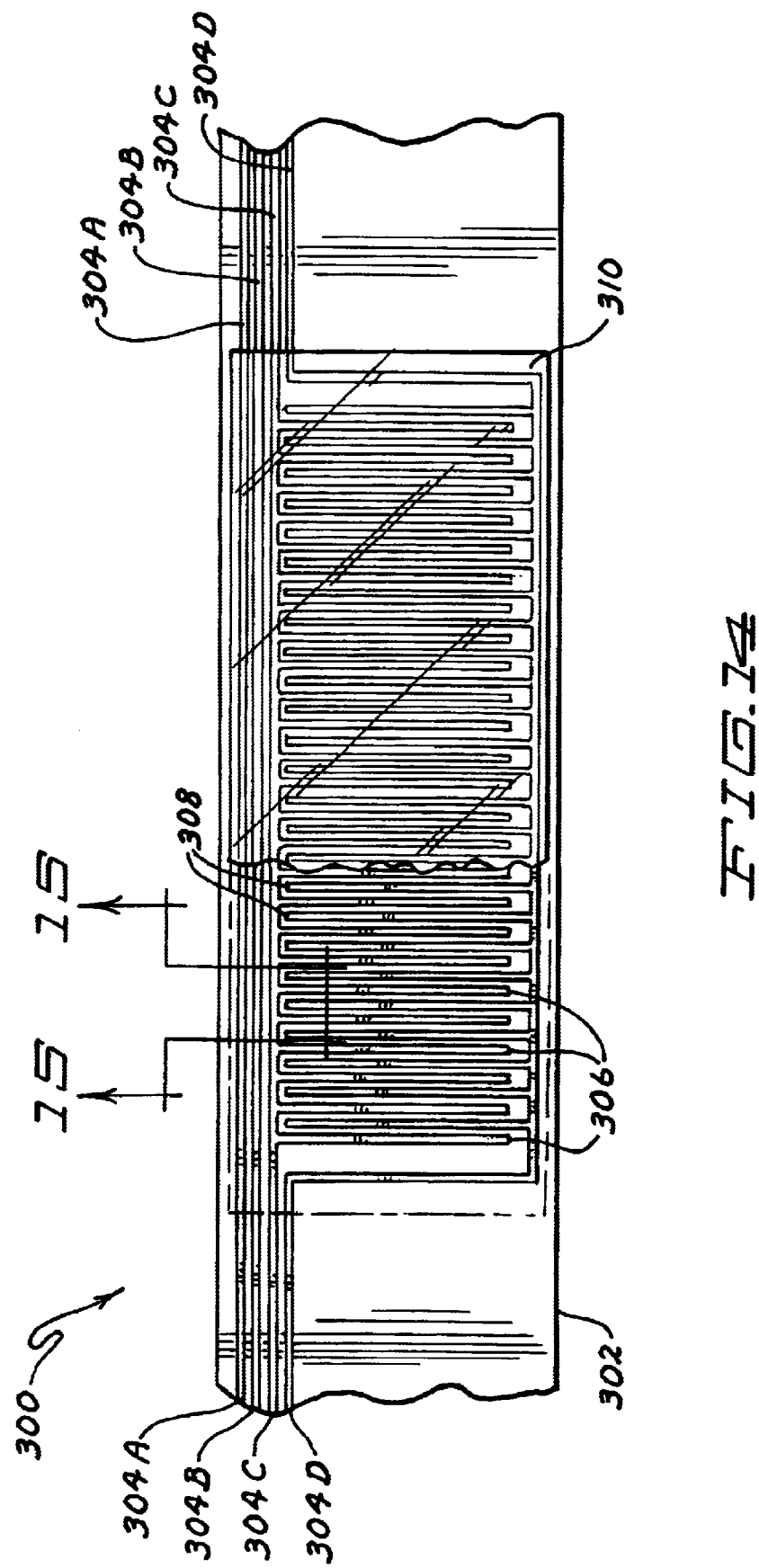
FIG. 14 illustrates another embodiment of an interconnect in accord with the present invention including a plurality interleaved "dead end" traces substantially completely enclosed within a carbonizable cover layer.

FIGS. 14 and 15 will now be described. FIG. 14 illustrates another embodiment of an interconnect 300 in accord with the present invention. Interconnect 300 includes a substrate 302 that supports a plurality of traces 304A–304D, with leads 304A and 304B being write traces, and leads 304C and 304D being read traces. Leads 304C and 304D branch into a plurality of interleaved dead end leads 306 and 308 respectively. The dead end leads function similarly to the interleaved dead end leads of FIGS. 12B and 13A, but are oriented substantially at right angles to the longitudinal axis of the interconnect. FIG. 14 thus illustrates that the interleaved dead end leads could be oriented at any angle relative to the longitudinal extent of the interconnect, that is, parallel to, perpendicular to or any angle in between, and still provide the function of lowering the resistance of the shunt relative to the leads themselves. Thus, the present invention contemplates that any orientation of such interleaved leads are within its scope.

The interconnect 300 further includes a cover layer 310, which may be substantially coextensive with the substrate or may be discontinuous. As illustrated the cover layer 310 not only engages the top surfaces 312 of the traces 304A–304D but substantially fills the space between them also. Thus, an interconnect in accord with the present invention may include a plurality of spaced apart traces wherein at least a pair of the traces will each have a carbonizable material engaged or touching at least one surface of the traces. The interconnect 300 includes a plurality of traces encapsulated by carbonizable material, though, as noted, the present invention would include interconnects where only a single surface of the traces contacted the carbonizable material as shown in FIGS. 8A–13B. Such a complete encapsulation is not necessary, then, for an interconnect to fall within the scope of the present invention. Furthermore, even though FIGS. 15A illustrates an embodiment where the coverlayer touches the top surfaces 312 of the leads, such a cover layer could be applied to an interconnect except where a trace pattern such as that shown in FIGS. 12A–14 is present, with the cover layer not covering the top surfaces of the leads in that area.

Figure 15A:
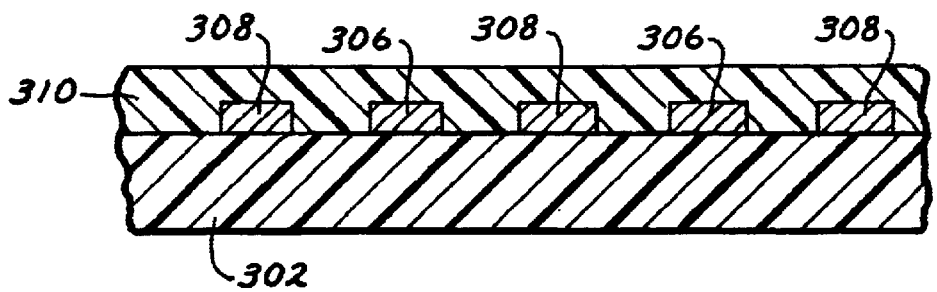
FIGS. 15A–15E depict in a cross sectional view the interconnect of FIG. 14 taken along viewing plane 15—15 thereof and illustrates a method and interconnect in accord with the present invention.
Figure 15B:
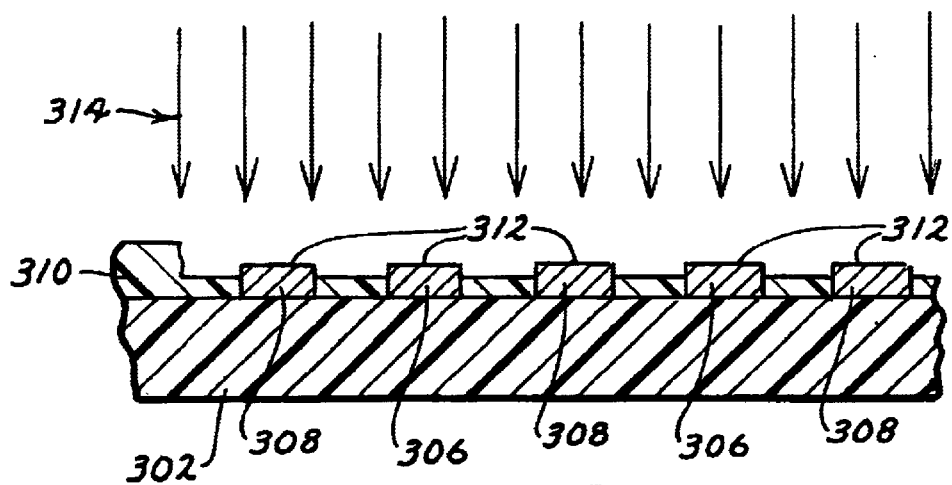

Reference will now be made to FIGS. 15A–15E, which illustrate a process in accord with the present invention. FIG. 15A is a cross section of the interconnect 300 taken along plane 15—15 of FIG. 14. FIG. 15A illustrates an interconnect prior to the beginning of the shunting process with a completely intact cover layer 310. FIG. 15B shows the application of a radiant energy 314 such as that provided by a UV laser source. The applied energy is of sufficient fluence and duration that the cover layer 310 is ablated as a result of its application to a depth sufficient to expose the top surface 312 of at least a pair of adjacent conductors. Alternatively, the interconnect 300 or any other interconnect with a varying trace pattern could begin the process with the conductors 304B–304D exposed.

Figure 15C:
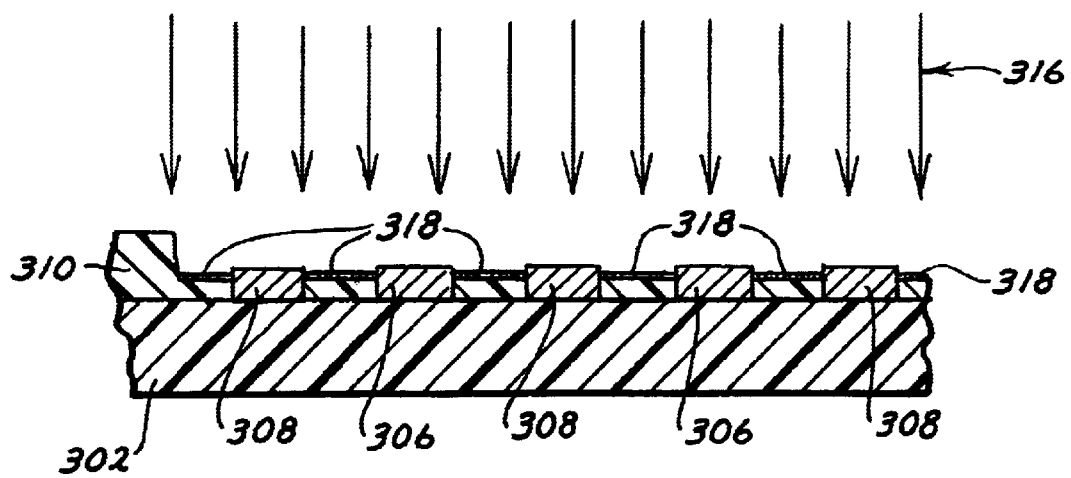
Figure 15D:
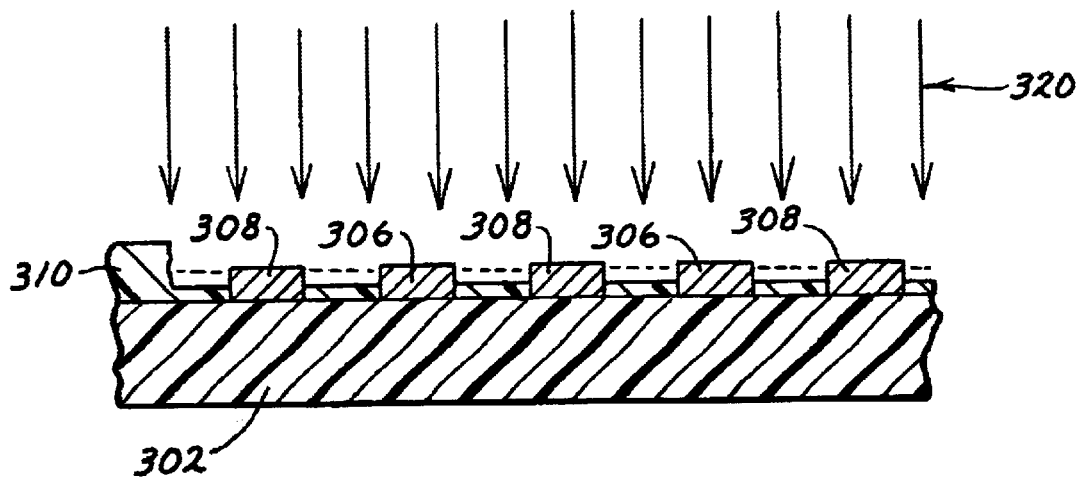
Figure 15E:
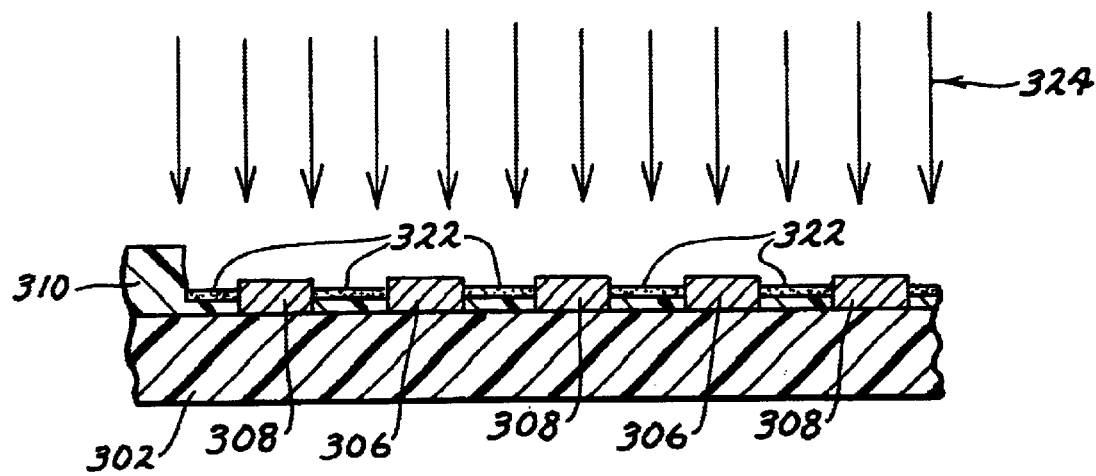

After the top surfaces 312 of the leads are exposed, a radiant energy 316 of a second, reduced fluence can be applied to the cover layer to create a carbonized surface or shunt 318 as previously described between a pair of adjacent leads as illustrated in FIG. 15C. The shunt 318 can be removed as illustrated in FIG. 15D by the application of an ablating radiant energy 320, which may have the same fluence as the radiant energy 314 and may be from the same source. As previously noted, a new shunt 322 can then be recreated by the application of a carbonizing radiant energy 324, which may have the same fluence as radiant energy 316 and may be from the same source. In this manner, then, the shunt may be created, removed, recreated and re-removed as desired without physically engaging the interconnect.

It will be observed in FIGS. 15A–15E that the process of shunting, deshunting, and reshunting an electrical component in accord with the present invention results in an "erosion" or dissipation of the material being carbonized and ablated. Thus, the embodiment shown in FIGS. 14 and 15A–15E provide an advantage over those shown in the other figures in that it provides a ready reservoir of carbonizable and ablatable material, whereas the other embodiments illustrated in the other figures would eventually result in an erosion of material away from the leads.

Figure 16:
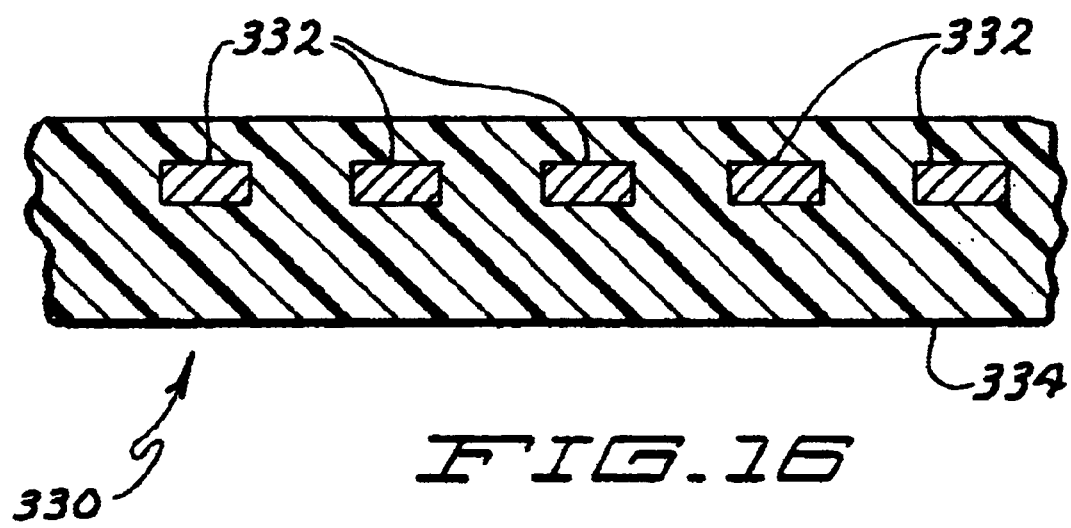
FIG. 16 illustrates in a cross section view another embodiment of an interconnect in accord with the present invention and shows a plurality of electrical traces embedded substantially within a single carbonizable, ablatable material.

FIG. 16 illustrates yet another alternative embodiment 330 of the present invention wherein the leads 332 are supported by a singular carbonizable and ablatable material 334. That is, the present invention will find use where the electrical conductors to be shunted are supported by a substrate of one material and engaged by a cover layer of a second material and where the conductors are engaged by a single material. That is, the present invention will prove useful where a pair of adjacent conductors are engaged by one or more carbonizable and ablatable materials.

Figure 17:
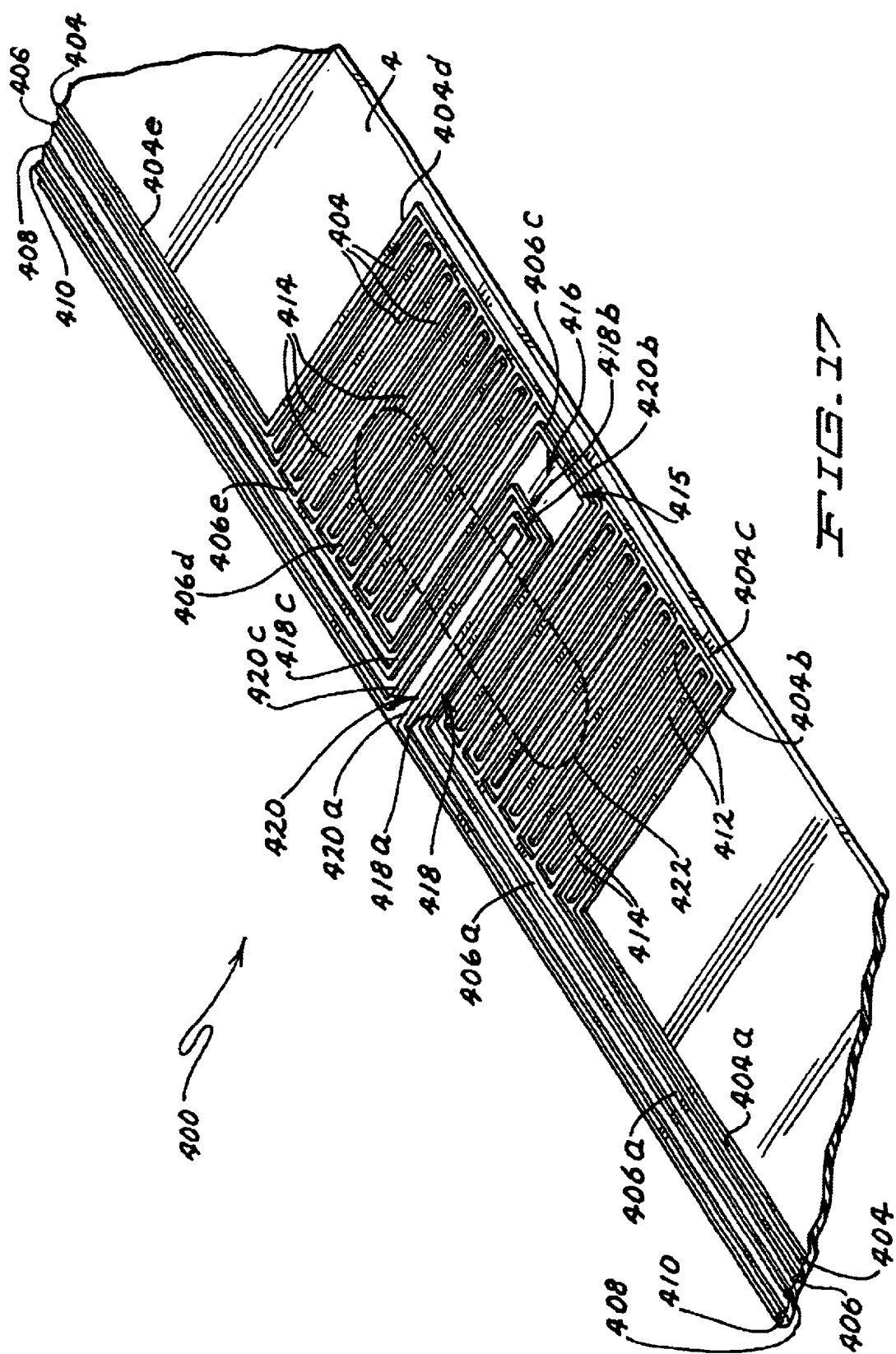
FIG. 17 shows another embodiment of an interconnect in accord with the present invention wherein the write leads are brought within a u-shaped configuration formed by the read leads.

Referring now to FIG. 17 another embodiment 400 of a partially depicted interconnect in accord with the present invention will be described. Interconnect 400 includes a substrate 402 supporting read leads 404, 406 and write leads 408, 410. As with other embodiments shown and described previously, interconnect 400 may also include a ground lead.

Read leads 404, 406 each include a lead segment or trunk 404a, 406a, respectively, from which at least one, and as shown in the Figure, a plurality, of dead end branch leads 412, 414, respectively, extend towards the other lead segment such that the dead-end leads are interleaved with each other.

Typically the leads 404–410 will be manufactured so as to lie substantially parallel to each other as shown in the figures, though this is not required as is well understood by those skilled in the art. Read leads 404 and 406 each include a first lead segment 404a and 406a, respectively, that extends substantially parallel to each other as shown in the Figure. It will be further observed that lead 404 includes a segment 404b that extends angularly with respect to segment 404a and a segment 404c that extends angularly with respect to segment 404b. From segment 404c at least one dead end lead 412 extends. Preferably, a plurality of such dead end leads 412 will extend from lead segment 404c. Lead 404 further includes a lead segment 404d that extends angularly from lead segment 404c and a lead segment 404e that extends angularly from lead segment 404d. It will be understood that lead segments 404a–404e are angularly disposed relative to adjacent segments and that as shown, the angle is substantially a right angle. Such form a continuous pathway for the conduction of electrical signals to and from the read write head. It will also be observed that lead segments 404b–404d form a somewhat u-shaped structure into the middle of which the dead end leads 412 extend.

Referring to FIG. 17 still, it will be observed that lead 406, in addition to lead segment 406a, includes lead segments 406b, 406c, 406d, and 406e. Each of the segments is angularly disposed relative to the adjacent segments. Dead end leads 414 extend angularly from lead segments 406a and 406e. Dead end leads 414 extend so as to be interleaved with the dead end leads 412. It will be observed that lead segments 406b, 406c, and 406d cooperate to form a somewhat u-shaped structure 415.

Disposed in the midst of the u-shaped structure 415 formed by lead segment 406b–406d is a gap 416 into which write leads 408, 410 extend. As illustrated, each write lead 408, 410 includes a "loop" or "u-shaped" portion 418, 420, respectively formed here by loop segments 418a, 418b, and 418c and 420a, 420b, and 420c. U-shaped portion 420 is nested within u-shaped portion 418, which is in turn nested within u-shaped portion 415. Stated otherwise, interconnect 400 includes a serpentine or sinuous portion of the write leads disposed in the midst of the dead-end leads extending from the read leads. With this configuration of the read/write leads, a shunt could be applied as indicated by the phantom outline 422 that would extend across the dead end read leads 412, 414, and the write leads 408, 410, creating three shunts: across the read leads, across the write leads, and across the read and write leads. Such a shunt would enable the resistance between the write leads to be lowered, though not to the same extent as the read leads. It will be understood that the shunt 422 could be made large enough to include all of the dead end leads; that is, that the shunt can be sized as desired and placed as desired with the use of the appropriate mask and positioning of the interconnect at the time of the shunt creation. The foregoing described interconnect 400 would enable all of the leads to be shunted together. A particular advantage of the interconnect 400 is the creation of a low resistance shunt between the reader leads as previously described and a high resistance shunt between the read and write leads in combination with a high resistance shunt between the write leads. Since the read head is more susceptible to damage from ESD/EOS than the write head, such a structure allows for greater protection of the read head while still offering protection to the write head. Though the Figure shows the leads and lead segments as being laid down such that right angles are formed between adjacent non-parallel segments, it will be understood that such an angular relationship is not required and that any angular relationship that provided that the lead segments remained electrically isolated for operational purposes except when a shunt was applied as described herein would suffice. Additionally, while the Figure shows both write leads 408 and 410 being "brought" within the u-shaped structure formed by lead segments 406b–406d, it will be understood that only one lead, here lead 408 and hence portion 418, can be brought within the u-shaped portion 415 formed by lead segments of read lead 406. Additionally, it will be understood that portions 415, 418, and 420 are not limited to the precise geometry of the u-shaped structures disclosed here. That is, any lead structure essentially forming an open "loop," coil or arch-like structure such that a portion of another lead can lead into and out of the open loop, coil, or arch-like structure is within the scope of the present invention.

Figure 18:
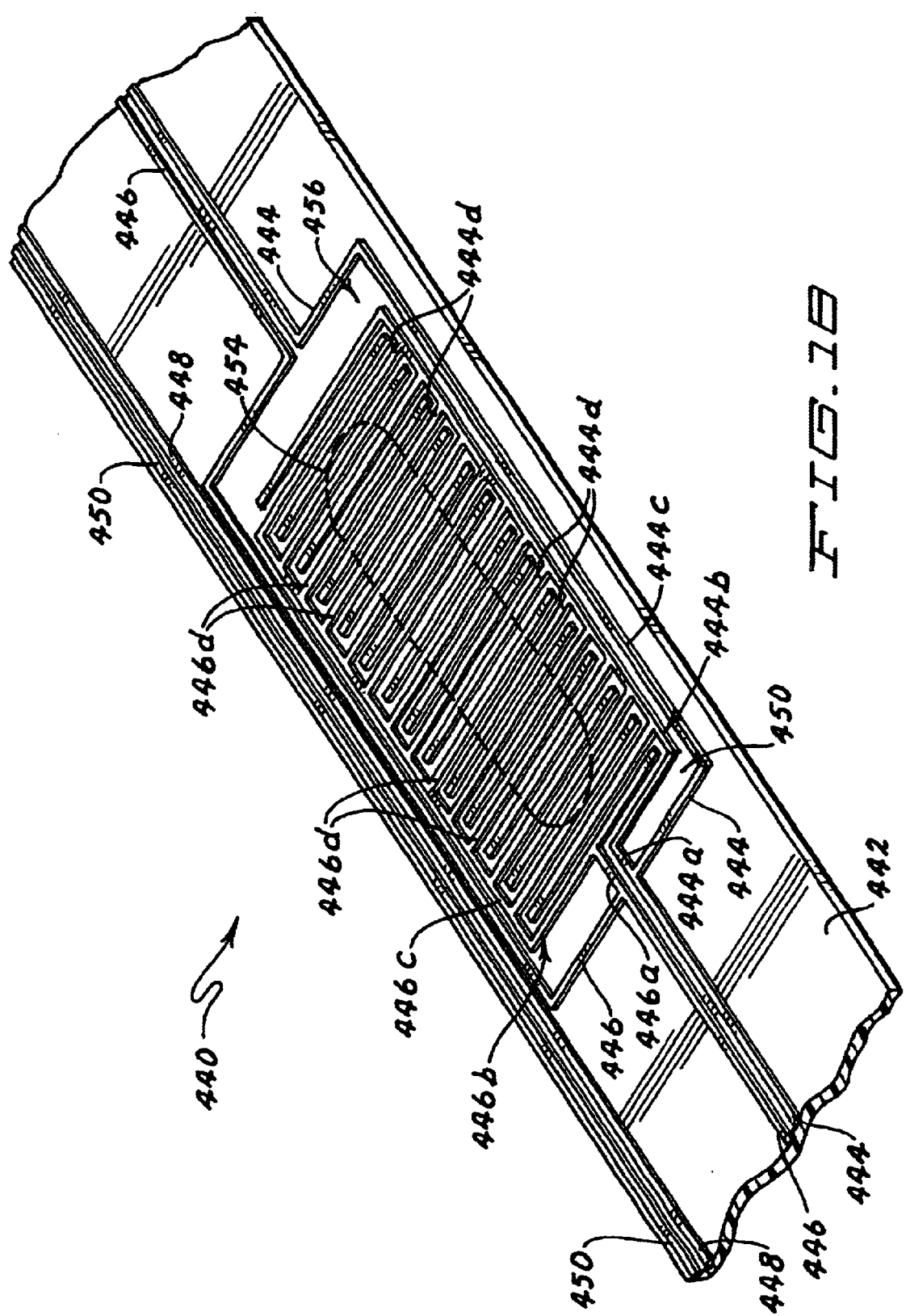
FIG. 18 illustrates yet another embodiment of an interconnect in accord with the present invention wherein the dead end read leads are connected to the read leads by a severable lead segment.

Referring now to FIG. 18, another embodiment 440 of a partially depicted interconnect in accord with the present invention will be described. Interconnect 440 includes a substrate 442 that supports read leads 444, 446 and write leads 448, 450. As with other embodiments shown and described previously, interconnect 440 may also include a ground lead. As illustrated, read leads 444, 446 extend in a generally side-by-side fashion and then diverge from each other so that they are spaced apart for a predetermined distance along the interconnect 440, after which they converge to travel again along the interconnect 440 in a substantially side-by-side fashion, thus forming therebetween a field or area 452 on the substrate 442.

Severable leads 444a and 446a extend from the leads 444, 446 respectively into the field 450. Each severable lead 444a, 446a then angularly branches into a lead segment 444b, 446b. Lead segments 444c, 446c then extend angularly from lead segments 444b, 446b, respectively. From lead segments 444c, 446c dead end lead segments 444d, 446d extend toward each other in an interleaved relationship as shown in the Figure. As with the embodiment shown in FIG. 17, a shunt 454 could be laid down in the manner previously described.

Lead segments 444a and 446a could be cut or ablated to cut off the shunt 454 electrically from the remainder of the interconnect leads. Such a complete electrical severance or disconnection of the dead-end leads from the read leads 444 and 446 would substantially ensure that the dead end leads did not affect the electrical performance of the read circuit in any way.

Figure 19:
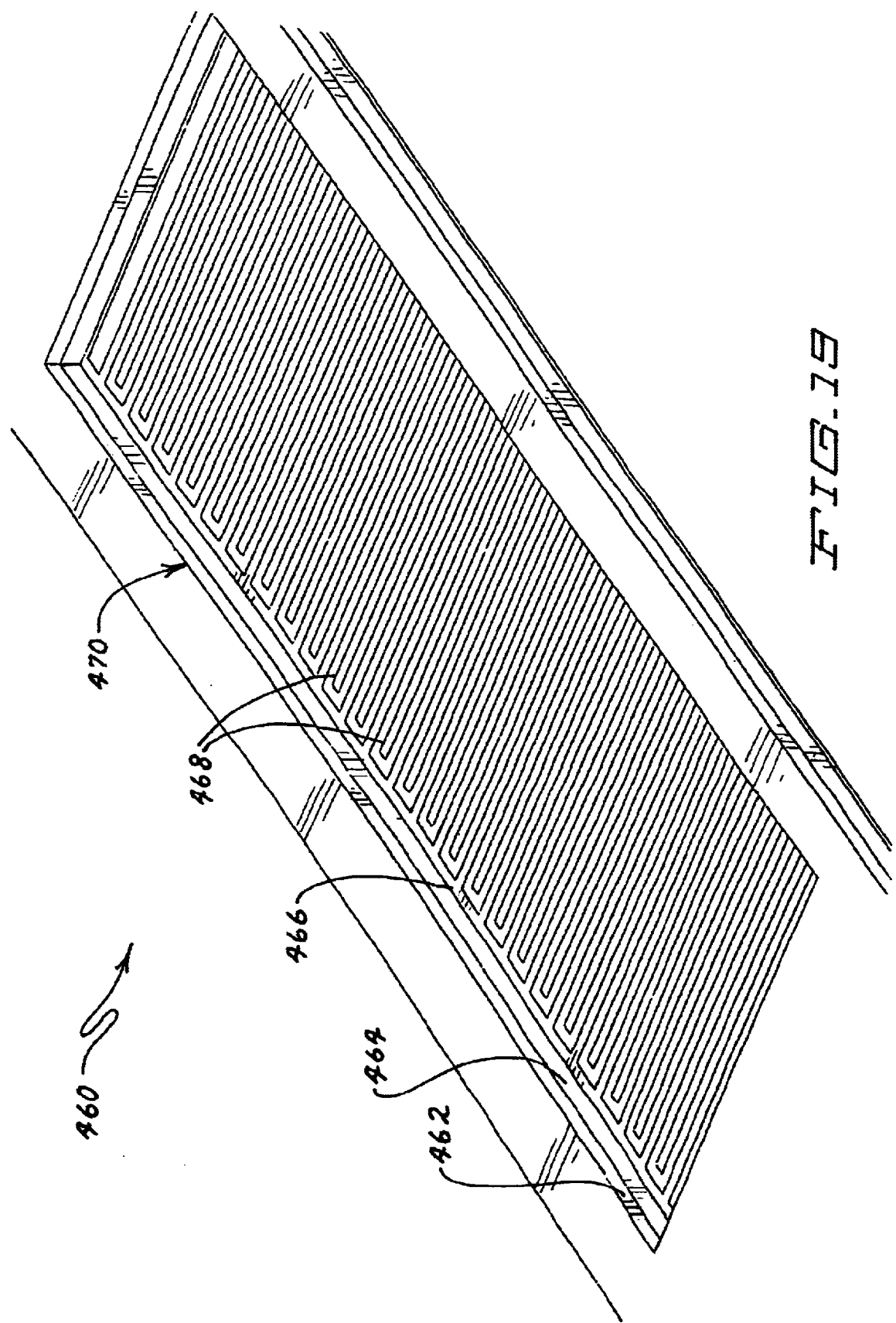
FIG. 19 illustrates still yet another embodiment of an interconnect in accord with the present invention wherein the carbonizable material is attached to a metal backing layer.

FIG. 19 depicts another embodiment 460 of a partially illustrated interconnect in accord with the present invention in a perspective view from the underside thereof. Interconnect 460 includes a metal layer 462, a substrate layer 464, read leads 466 and 468 supported by the substrate layer 464, and a "cover layer" 469 made of a carbonizable material that overlays and extends between the leads 466 and 468. It will be understood that write leads may also be supported by the substrate layer 464. As with other embodiments shown and described previously, interconnect 464 may also include a ground lead. The metal layer 462 includes a window 470 through the metal layer 462 that may function as a mask during the shunting/deshunting procedures. It will be understood that in the view shown here that the substrate layer 464 has been ablated or otherwise removed in any known manner in the area of the window 470 so as to expose the interleaved dead-end leads of the read leads 466, 468 and that the cover layer material 469 fills the gaps between the dead-end leads. The removal of the substrate 464 in the area of the window 470 thus results in the creation of a substrate window 471, which is substantially the same configuration as said metal backing layer window, though it will be understood that the relative configurations of the windows 470, 471 is not critical to the present invention, only that they both provide access to the carbonizable cover layer 469. Thus, with the utilization of a metal backing layer, such as that found in trace suspension assemblies (TSAs), the mask for creation and removal of the shunt can be built into the assembly itself.

Figure 20:
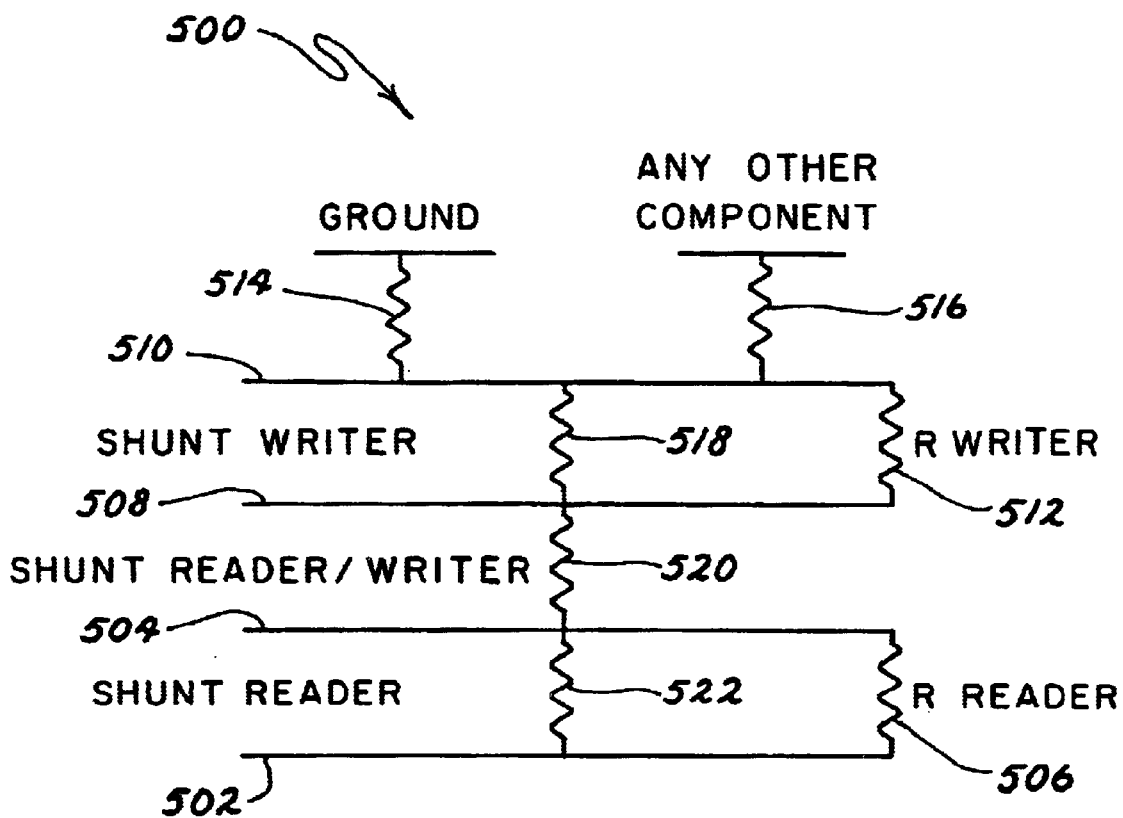
FIG. 20 shows a simplified circuit diagram of the shunted interconnect.

FIG. 20 shows a basic electrical circuit 500, including the read leads 502, 504 extending to and from the read head indicated as resister 506 and the write leads 508, 510 extending to and from the write head indicated as resister 512. The circuit 500 also shows a plurality of shunts 514–22. Shunts 514 and 516 extend between one of the write leads, here lead 510, and the ground and other electrical components, respectively. Shunts 518, 520, and 522 are preferably of the type discussed herein, that is, shunts created on a carbonizable surface by the application of a radiant energy to the surface. These latter shunts are easily removed as described herein by ablation of the surface.

Figure 21:
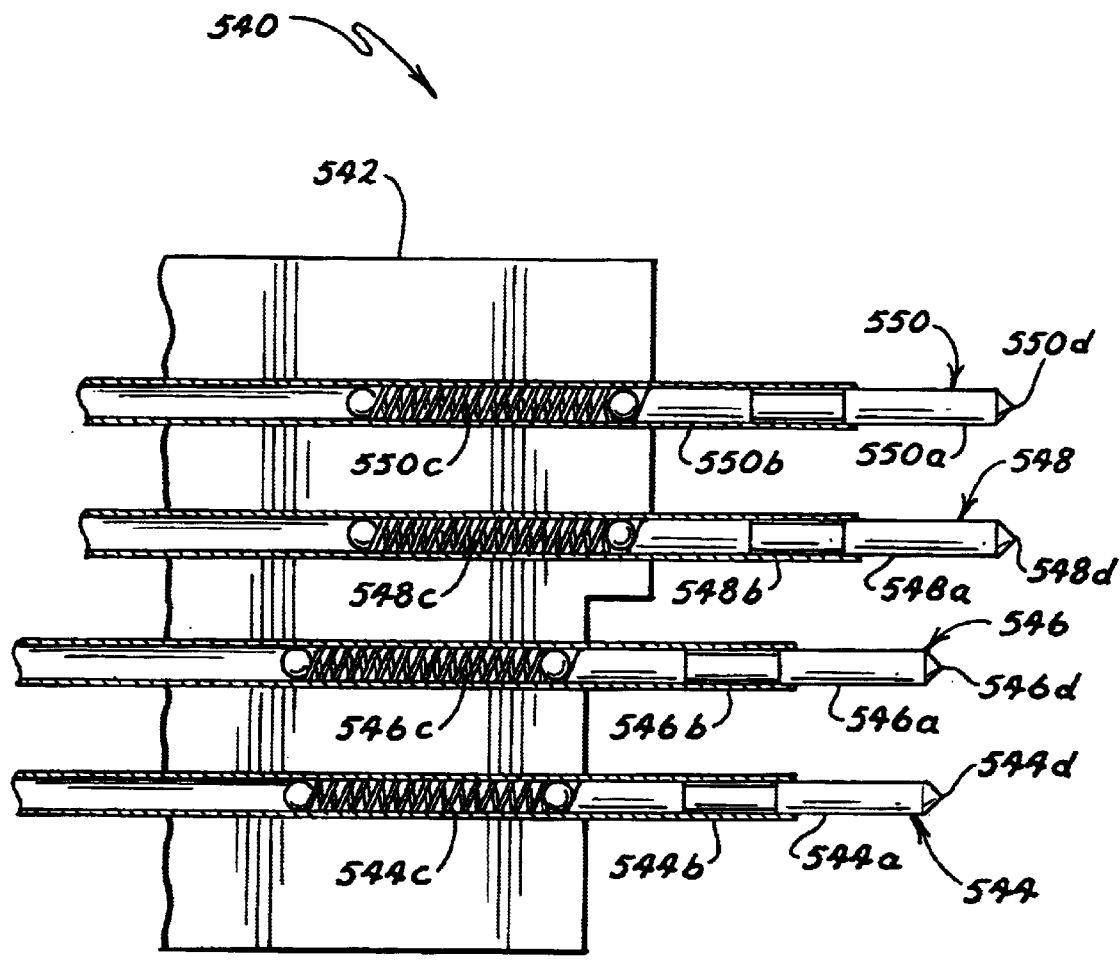
FIG. 21 depicts a portion of a test fixture including pogo pins useful for making electrical contact with an interconnect in accord with the present invention while reducing the likelihood of damage due to ESD/EOS.

Referring now to FIG. 21, an electrical connection portion 540 of a test apparatus of the kind that may be used with the present invention is illustrated. During assembly of the various components ultimately resulting in a hard disk drive, the components are placed in various fixtures and electrically connected in order to perform certain electrical tests on them, such as continuity testing or dynamic electrical testing (DET). The electrical connections may be made in various ways, among them the engagement of a plurality of appropriately configured pins with the test pads or contacts previously discussed. The pins may be "pogo pins," that is, spring loaded pins that ensure good contact with the pads or contacts. Thus, portion 540 includes a structure 542 supporting a plurality of pogo pins 544–550. Each pogo pin 544–550 includes a contact pin 544a–550a, respectively, mounted with a shaft 544b–550b, respectively, for reciprocal motion. Each pogo pin 544–50 further includes a spring 544c–550c, respectively biasing the respective contact pin 544a–550a outwardly. Thus, as the outer tips 544d–550d of the pogo pins 544–550 makes physical contact with the test pads of an interconnect, the contact pins 544a–550a will be moved inwardly within its respective shaft 544b–550b, thereby compressing its respective spring 544c–550c and creating an outward bias force enabling good contact to be maintained between the tips 544d–550d and the test pads of the interconnect. It will be observed that pogo pins 544 and 546 do not extend outwardly as far as the pogo pins 548 and 560. The present invention contemplates that pogo pins 544 and 546 will make contact with the pads associated with the reader leads and that pogo pins 548 and 550 will make contact with pads associated with the write leads. Thus, as the portion 540 is brought into position for the pogo pins to engage the test pads of an interconnect, the pogo pins 548 and 550 will make the initial contact with the test pads for the write leads. This initial contact with the write leads will allow or enable a slower, more controlled drain of static charge from the read leads where those leads are shunted to the write lead, as would be the case with interconnect 400, for example, at a higher resistance. That is, because of the shunt of the read leads to the write leads, some discharge will occur from the read leads through the write leads, the write test pads, and the pogo pins 548 and 550 just prior to pogo pins 544 and 546 making electrical contact with the test pads for the read leads. The relatively higher resistance, however, will slow the drain and prevent a potentially damaging discharge from occurring. This method of establishing the contacts can be advantageously used with the slider body, suspension, and any other electrical leads that may be present.

Figure 22B:
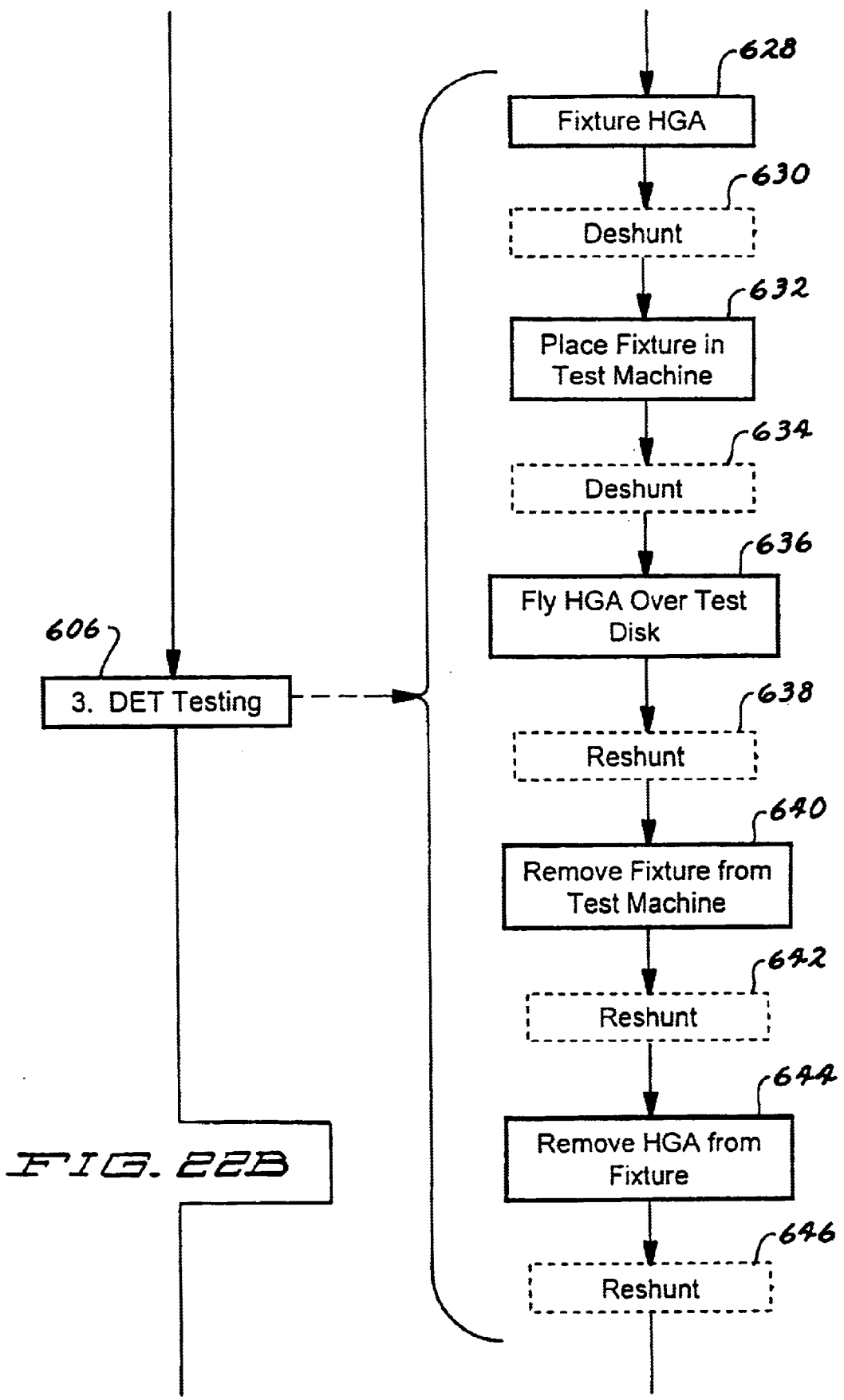
Figure 22C:
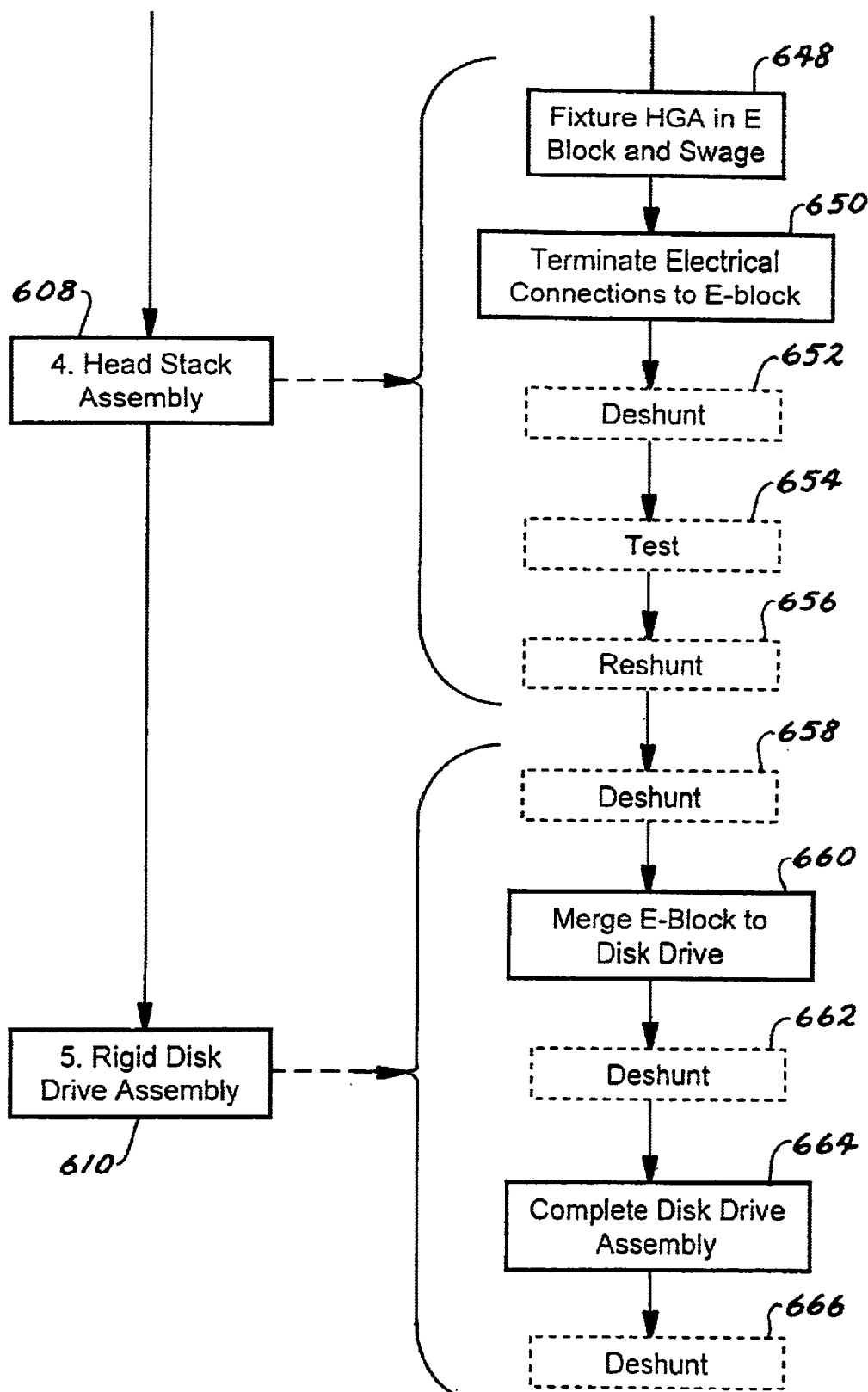

Referring to FIGS. 22A–22C, a generalized assembly and test process 600 for the construction of a hard disk drive is broadly illustrated in accord with the present invention. The manufacturing steps discussed hereafter, can be performed by multiple manufacturers or by a single manufacturer. It will be understood that the steps shown in a dashed outline in FIGS. 22A–22C may or may not take place, depending upon the particular manufacturer. Generally speaking, process 600 includes a number of steps collectively known as component fabrication as indicated at 602, followed by HGA assembly as indicated at 604. After the HGA is assembled, the HGA will undergo a dynamic electrical test (DET) as indicated at 606. If the HGA passes the DET, then the HGA will be assembled to the E-block in a process known generally as the head stack assembly, as indicated at 608. Finally, the assembly of the rigid disk drive will be undertaken, as indicated at 610. Each of the foregoing general steps includes one or more substeps or processes as will be explained further below. The steps 602–610, inclusive, can be performed by multiple manufacturers or by a single manufacturer and will be elaborated upon below.

Component fabrication step 602 involves a number of steps involved in the creation of the various parts, such as the suspension, the flex circuit, the slider, the head, etc., forming the HGA. These steps may include various etching processes as indicated at 612, which may be metal and/or polymer etching of the interconnects and suspensions depending upon the particular manufacturer. Following the appropriate etching processes, a cover layer will be applied to the interconnect as indicated at 614. The interconnects may be fabricated in the form of sheets or as strips. Following application of the cover layer, a shunting procedure as disclosed herein, which may involve an ablation of the cover layer as set forth above, if necessary, may be performed on the interconnects, as indicated at 616.

Regardless of whether the shunt is performed after the cover layer is applied, construction of the suspension assembly will be undertaken as indicated at 618. Various types of suspensions are known in the art, including trace suspension assemblies (TSAs) and flexible circuit suspension assemblies (FSAs). This assembly will involve attaching the interconnect to the suspension where an FSA is being constructed. At this stage of the assembly process, if the interconnects have been laid down as sheets they will have been cut at least into strips if not into individual parts. If the shunt has not been previously applied as at 616, then the shunt may be applied as indicated at 620 following TSA/FSA assembly to the individual strips or the completed suspensions.

From here the head gimbal assembly (HGA) process 604 continues. Generally, regardless of the form of suspension as presently manufactured, this step will involve attachment of the slider/head to the suspension, presently with an adhesive as indicated at 622. Regardless of when the shunt is applied previously in the process, it is preferred that it be complete when the slider and head are bonded to the suspension since the very act of bonding involves physical contact that can create a static discharge and damage the head. Once the slider/head are attached, the read/write heads can be electrically connected to the interconnects as indicated at 624. If desired, though it is believed not to be preferable unless made necessary because of manufacturing reasons, the shunt can then be removed as by ablation as indicated at 626.

Following HGA assembly, the assembly process will continue with the DET 606. This testing procedure provides several opportunities to deshunt and reshunt the HGAs as desired. This test procedure may involve fixturing the HGA, that is, placement of the HGA within a specially configured fixture, as indicated at 628. If desired, the shunt can then be ablated or otherwise removed as indicated at 630. Regardless of whether the shunt is removed at 630, the fixture holding the HGA to be tested will then be placed in the testing equipment for the conduct of the desired tests of the electrical and magnetic properties of the HGA as indicated at 632. If the shunt has not previously been eliminated as at 626 or 630, it must now be removed for testing to occur as indicated at 634. The HGA being tested will then be "flown" over a test disk and the desired tests will be performed as indicated at 636.

Once this test is complete, various opportunities present themselves for the shunt to be reapplied. For example, assuming a successful test, the shunt can be reapplied immediately after the completion of the test as indicated at 638. Alternatively, the fixture could be removed as indicated at 640 and the shunt applied after removal as indicated at 642. Regardless as to whether the shunt is applied after removal of the fixture from the testing equipment, the HGA will be removed from the fixture as indicated at 644 following removal of the fixture from the testing apparatus. If the shunt has not been reapplied at either 638 or 642, then it can be reapplied at this point as indicated at 646. It is believed preferable to reapply the shunt either immediately after testing is complete at 638 or after removal of the fixture from the testing apparatus as indicated at 642. Early reshunting will lessen the chance that a damaging ESD/EOS event could occur. Thus, it is preferable to reshunt at least the read head as soon as possible after the shunt is removed for manufacturing reasons to minimize the time frame that at least the read head is left unprotected from ESD/EOS.

Once testing is completed, the HGA will be removed and assembled into the head stack, for example but without limiting the present invention, as previously mentioned at 608. That is, the HGAs will be attached to the E-block, by way of example only and without any intent to limit the present invention, through a swaging process as indicated at 648. The electrical interconnects will be electrically connected or terminated to the appropriate electrical connections in the E-block as indicated at 650. If desired, the interconnect can then be deshunted as indicated at 652 for further testing as indicated at 654. The interconnect may then be reshunted as indicated at 658 prior to the final assembly steps involved in the rigid disk drive assembly as indicated at 610. Once again, it is preferable, though perhaps not necessary depending upon whether the final assembly steps will occur at a different location, such as another assembly building or at a remote location. Since any movement involves physical contact and the opportunity to generate static charges leading to damaging ESD/EOS, where the time lag between steps 608 and 610 is large or the steps occur remotely from each other it is preferred that the shunt be reapplied at 656 if it has been removed previously at 652.

The final assembly steps 610 also present multiple opportunities for final shunt removal. For example, the shunt can be removed as indicated at 658 (if not previously removed at 652 and not reshunted at 656) prior to the merging of the E-block with the disk drive as indicated at 660. If the shunt is not previously removed, it can then be removed as indicated at 662 following the merging 660. Alternatively, the remaining assembly steps, including encasement of the disk drive can be completed as indicated at 664 and the shunt then finally removed as indicated at 666. It will be understood that the final deshunting step will in part be dictated by the particular manufacturer's design. That is, in some instances it may not be possible to remove the shunt following merger 660, thus requiring deshunting at 658. With other manufacturers, it may be possible to apply a radiant energy source through an appropriately configured and positioned aperture in the disk drive case such that the deshunting can occur as at step 666. As noted, however, it is generally preferred, though particular manufacturing designs and process may require otherwise, to leave the shunt in place as long as possible to minimize the potential for ESD/EOS damage.

It will also be understood that testing will occasionally indicate faulty devices. Where this occurs, commonly known as rework, the shunts may be reapplied and removed as needed.

The present invention having thus been described, other modifications, alterations, or substitutions may now suggest themselves to those skilled in the art, all of which are within the spirit and scope of the present invention. For example, rather than creating the shunt directly on the substrate, a carbonizable and ablatable material, such as an adhesive, may be used to fill the spaces between the leads on the substrate. That is, the adhesive or carbonizable/ablatable filler material could be laid down between the leads and then could be converted into a shunt and subsequently removed in any acceptable non-contact method including the application of a radiant energy source such as a laser beam.

In addition, the present invention could find many instances of application during the process of assembling a hard disk drive. By way of example only and without any intent to limit the scope of the present invention or the attached claims, the process could find use while: shunting the slider body of a read/write head; shunting the suspension; shunting a pre-amplifier; shunting a micro-actuator; creating a shunt at a site behind the test pads; creating a shunt a site between test pads and termination pads; creating a shunt at a site between termination pads and head; creating a shunt at an intermediate circuit between the head and actuator flex; or by creating a shunt on a dual layer interconnect.

In addition, by way of example only and without any intent to limit the scope of the invention or the attached claims, the present invention finds use with a laser operating just below the ablation threshold during carbonization; performing the processes at the circuit(component) level process; performing the process at the head gimbal assembly or test process; performing the process at the head stack assembly or test process; performing the process at the drive level assembly or test process; while parts are fed past the laser and optics; while parts are in a holding tray or fixture and the tray is positioned with respect to the laser and optics; while the parts are positioned manually with respect to the laser and optics; while a beam steering mechanism is used to direct the laser beam at the parts being acted on; while measuring resistance during the process for process feedback; while the parts are in an inert environment; while the parts are in an oxygen rich environment; acting on designs that open at the beam perimeter; acting on polymer fill; acting through the substrate; where the polymer is acrylic based; where the material is a composite; using the process in combination with a removable section; using the process on multiple sites along the interconnect to create a plurality of shunts simultaneously or at separate times; performing the process with vacuum or air to remove debris; and while targeting specific resistance values to be achieved in the shunt.

In addition, again by way of illustration and not as a limitation on the invention or the attached claims and as described in some cases above, the present invention may find use on a coverlayer boundary; coverlayer holes; substrate holes; trace separation or routing; with an excimer laser; with an imaging lens; with a mask; with an attenuator; with a laser beam homogenizer; by using the $3^{rd}$ and $4^{th}$ harmonic of a Nd:YAG laser; with a polymer/conductor; with a polymer and a semi-conductor; material.

As illustrated herein, the present invention finds a wide variety of applications. It is therefore intended that the present invention be limited only by the scope of the attached claims below.

What is claimed is:

1. An interconnect for connecting at least a pair of spatially separated electronic/electrical components, said interconnect comprising:

at least a pair of leads extending between the components, wherein each of said leads includes at least one dead-end lead extending therefrom, said dead-end leads lying substantially adjacent to each other;

a carbonizable support material engaging said leads; and a shunt being formed by a carbonized area of the surface of said support material extending between and engaging at least said substantially adjacent dead-end leads, said shunt being provided for substantially protecting said interconnect from ESD/EOS damage.

2. The interconnect of claim 1 wherein one of the electronic/electrical components is a read/write head of a memory storage device and said at least a pair of leads includes a first pair of read leads extending to and from the read/write head, said interconnect also including a pair of write leads extending to and from the read/write head.

3. The interconnect of claim 2 wherein said dead-end leads extend angularly with respect to said read leads.

4. The interconnect of claim 2 wherein said pair of read leads extend substantially parallel to each other and then diverge to define a dead-end lead field on said support material and wherein said dead-end leads extend into said dead-end field into an interleaved relationship.

5. The interconnect of claim 2 wherein a first of said first pair of read leads substantially defines a u-shape and said dead-end leads extend from said u-shape and wherein said dead-end leads extending from a second of said first pair of read leads extend into an interleaved relationship with said dead-end leads from said first read lead.

* * * * *